US009654054B1

United States Patent
Omoumi et al.

(10) Patent No.: US 9,654,054 B1
(45) Date of Patent: May 16, 2017

(54) DEVICE AND METHOD FOR SATURATION PREVENTION BY TRANSFER FUNCTION MODULATION ASSOCIATED WITH CONDITIONING OF ELECTRICAL CURRENT OR VOLTAGE

(71) Applicant: Technology for Energy Corp., Knoxville, TN (US)

(72) Inventors: Kevin Christopher Omoumi, Cookeville, TN (US); Allen Vaughn Blalock, Louisville, TN (US)

(73) Assignee: Technology For Energy Corporation, Knoxville, TN (US)

( * ) Notice: Subject to any disclaimer, the term of this patent is extended or adjusted under 35 U.S.C. 154(b) by 0 days.

(21) Appl. No.: 14/872,107

(22) Filed: Sep. 30, 2015

Related U.S. Application Data

(60) Provisional application No. 62/057,758, filed on Sep. 30, 2014.

(51) Int. Cl.
*H03L 5/00* (2006.01)
*H03C 1/06* (2006.01)

(52) U.S. Cl.
CPC .................................. *H03C 1/06* (2013.01)

(58) Field of Classification Search
CPC ....................................................... H03C 1/06
See application file for complete search history.

(56) References Cited

U.S. PATENT DOCUMENTS

| | | | |
|---|---|---|---|
| 4,937,721 A * | 6/1990 | Person | G05F 1/563 363/47 |
| 5,153,510 A | 10/1992 | Kominsky | |
| 6,070,058 A | 5/2000 | Waldroup et al. | |
| 6,194,910 B1 | 2/2001 | Davis et al. | |
| 6,603,301 B2 | 8/2003 | Benes | |
| 7,538,539 B1 | 5/2009 | Balke | |
| 7,615,988 B2 | 11/2009 | Blakely | |
| 8,143,880 B2 | 3/2012 | Vulovic et al. | |
| 2014/0253102 A1 | 9/2014 | Wood et al. | |
| 2014/0306690 A1 | 10/2014 | Hewson et al. | |

* cited by examiner

*Primary Examiner* — Daniel Puentes
(74) *Attorney, Agent, or Firm* — Pitts & Lake, P.C.

(57) ABSTRACT

The present general inventive concept is directed to provide a saturation prevention method that utilizes transfer function modulation to continuously and precisely condition signals over more than four orders of magnitude from a signal source. To avoid signal conditioning error and large transient behavior due to range switching, continuous conditioning of all ranges without saturation over the entire large input dynamic range is employed. The use of transimpedance amplifiers in an example embodiment induces negligible loading on the signal source such that the integrity of the original signal is fully maintained, enabling precise signal conditioning. The ratio of gain to input impedance with a transimpedance amplifier is orders of magnitude larger than other typical methods of signal conditioning, making these amplifiers optimum for the saturation prevention method. An example embodiment utilizes the saturation prevention method to maintain the expected signal gain and a low impedance load for the signal source to ensure the desired accuracy of the signal conditioning.

65 Claims, 6 Drawing Sheets

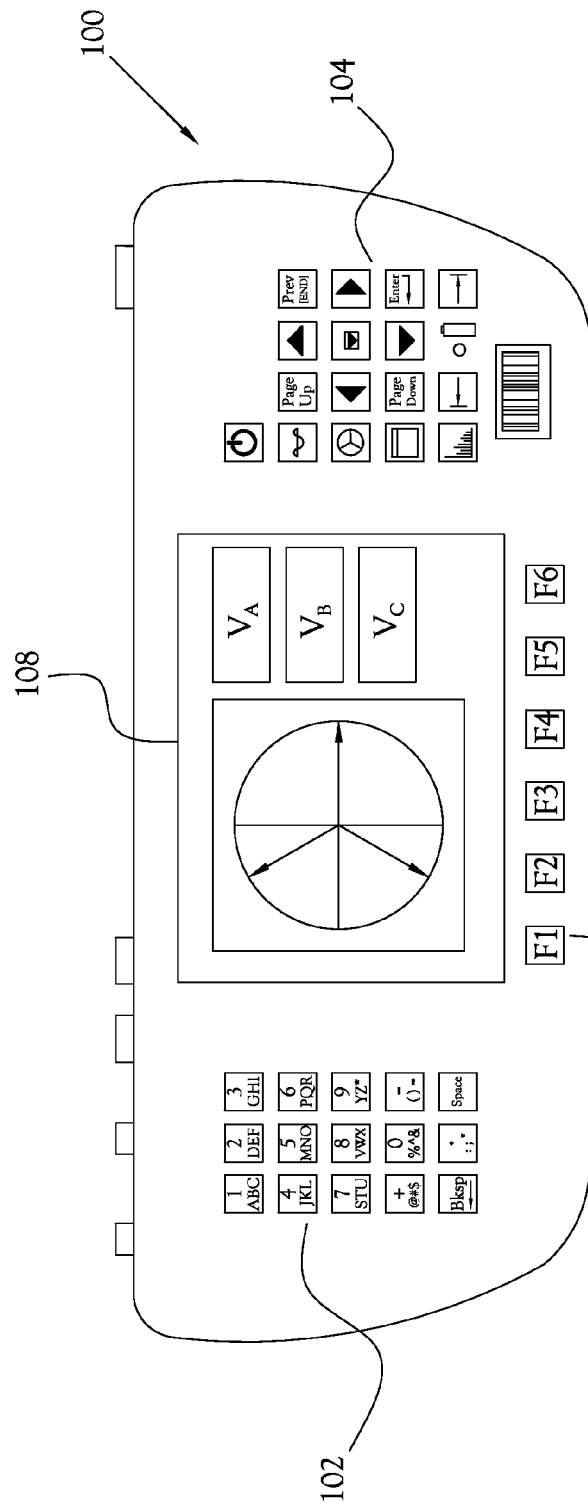
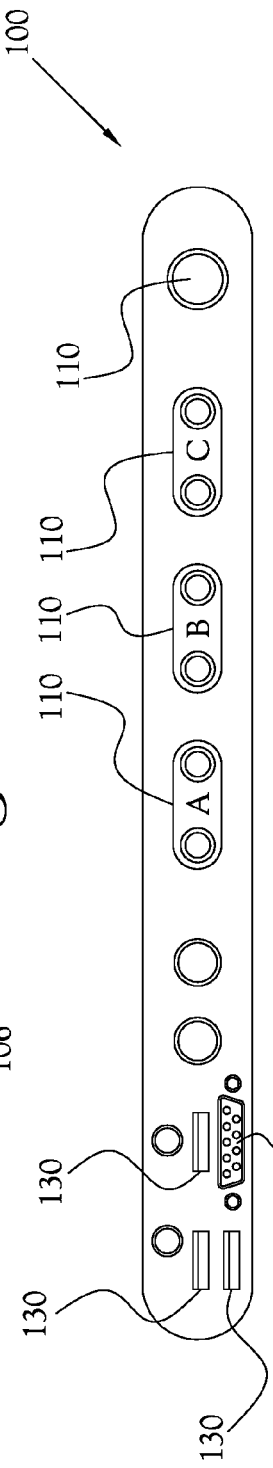
Fig. 1A
Fig. 1B

Fig.6a
Fig.6b
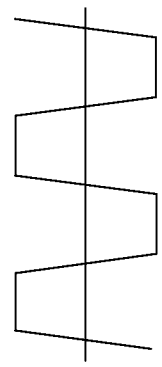
Fig.6e
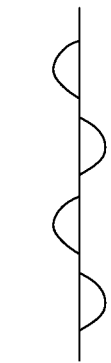
Fig.6d
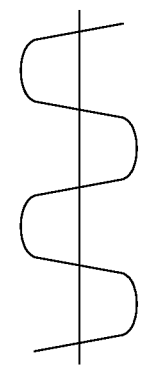
Fig.6c

DEVICE AND METHOD FOR SATURATION PREVENTION BY TRANSFER FUNCTION MODULATION ASSOCIATED WITH CONDITIONING OF ELECTRICAL CURRENT OR VOLTAGE

CROSS-REFERENCE TO RELATED APPLICATIONS

This application claims the benefit of U.S. Provisional Patent Application Ser. No. 62/057,758, filed on Sep. 30, 2014, the contents of which are incorporated herein by reference in its entirety.

FIELD OF INVENTION

The present general inventive concept relates to conditioning of analog signals, and, in particular, the conditioning of analog signals in applications where a large dynamic range of input signals must be converted with relatively high accuracy of reading (0.1% or better).

BACKGROUND

Many analog signal conditioning applications present unique challenges, but high-accuracy field applications can be especially difficult. The dynamic range of signals that must be supported may impose additional constraints.

One example problem encountered in a field application is that of electric service metering accuracy verification in the electric utilities industry, particularly in the area of electrical current-to-voltage conversion. This is due to the rapid changes in current amplitude that may span the entire conditioning range of the system. While computing energy by integrating power over an interval of time, any change in voltage or current not faithfully reproduced will produce significant error in the computed energy value. Therefore, a method is needed that is capable of precisely tracking a large range of current that may change amplitude quickly. In the case of current metering/monitoring, care must be taken in the design of signal conditioning circuitry placed on the output side of either a current transformer (CT) or a current source, to minimize errors and maximize the signal-to-noise ratio (SNR).

Some conventional current-to-voltage conversion devices employ different circuits that must be selected by switching between different circuitry according to the level of current involved. Conventional circuits may introduce too much burden on the secondary side of the current transformer causing a decrease in conditioning accuracy. Also, energy registration errors may be incurred while changing conditioning ranges as the switching process may produce transients or loss of data during the switching interval. Thus, a device to convert current with a low secondary burden is desired, and one that eliminates losses when the converted current changes amplitude rapidly over a large conditioning range.

Conventional techniques in common use for accurate, wide range conditioning of electrical current are often problematic in one or more aspects described herein. One such technique applies to conditioning of alternating electrical current using a current transformer (CT) coupled to an amplifier. This circuit is used to convert the CT current to a voltage signal that is an analogue of the CT current. The current-to-voltage amplifier is used in place of a discrete resistor to decrease the effective burden resistance applied to the output of the CT. Smaller burden impedance generally minimizes conditioning errors in the CT output current.

A current transformer (CT) is characterized by a primary winding having a small number of wire turns (which can be as small as one turn) around the transformer's magnetic core and a secondary winding on the same magnetic core having a large number of turns, possibly greater than 2000 turns. Typically, the magnetic core shape is toroidal. The current to be converted is a periodic alternating current connected to flow in the primary winding of the CT. This primary winding current induces a magnetic flux in the core that is an analogue of the primary current to be converted. In turn, the magnetic flux in the core induces a current in the secondary winding that consequently is also an analogue of the current to be converted except divided down by the ratio of secondary turns to primary turns. This step-down characteristic makes the CT particularly suited for the conditioning of large alternating currents.

A conditioning error intrinsic to use of CT devices for measuring electrical current is due to internal current division of the secondary current (is) between the magnetization and the leakage branches of the CT equivalent circuit as referred to the CT secondary. The magnetization branch impedance Zm is a parallel combination of a resistance Rc that accounts for the power losses in the core associated with the induced magnetic flux and an inductance Lm which accounts for the magnetization of the core. The leakage branch impedance Zl as described is a series combination of the leakage inductance Ll (due to imperfect coupling of the primary and secondary windings); the DC resistance Rw of the secondary winding wire; and the burden impedance Zb, which may be either resistive or inductive. Zb is the load placed on the CT output to receive and process the CT output current. The transfer function for the CT output current io due to internal current division with the secondary current inherent to the CT may be represented as:

$$\frac{io}{is} = \frac{1}{1 + \frac{Zl}{Zm}}$$

Note that when Zm is much greater than Zl, the expression reduces to very close to unity indicating that virtually all of the secondary current (is) flows in the leakage branch Zl. Recall that Zl is a series impedance combination including the burden impedance Zb. Cores are chosen for CT current to current conversion devices that have large magnetic permeability to loss ratios to maximize both the inductance Lm and the parallel loss resistance Rc that make up the CT magnetization branch impedance Zm. This is one factor that contributes to a desirably smaller Zl/Zm ratio. Since the burden impedance Zb is series included in the leakage branch Zl, a larger Zb will produce a larger Zl and thereby will contribute to an undesirable larger decrease from unity of CT internal current division as shown in the above relationship. A more subtle effect of larger burden impedance Zb is due to the accompanying increase in voltage this produces across the magnetization branch impedance Zm. Larger voltage across Zm will increase the peak magnetic flux density in the core thereby increasing core losses. This will decrease the effective size of the core loss resistance Rc, also decreasing the magnetization impedance Zm. This can contribute to a reduction of the CT internal current division from unity.

More commonly, a resistor is coupled to the output of a CT to convert the CT output current to a voltage for subsequent use in downstream processing and/or control. These CT devices are the type typically used to convert very large alternating currents; i.e., hundreds or thousands of amperes expressed as root of the mean of the squared (RMS) current waveform magnitudes. The CT inaccuracies produced by these discrete burden resistors are therefore factored into the determination of the CT accuracy class.

Another common technique for increasing the range of current-to-voltage conversion is to use a "bypass" mechanism for the low range portion of the current-to-voltage conversion circuitry arrangement when the current level exceeds the upper limit of the low current range. When the converted current reaches a pre-determined threshold level, a bypass of the low range input is activated to reduce insertion impedance of the low range conditioning circuit input. Unfortunately, this also renders the low range output non-responsive to conditioning current so long as the current remains above the low current-to-voltage conversion range. Much work has been done in the design of these low range "bypass" electronic circuits to minimize unwanted conditioning error-inducing signal transients, long settling times, and changes of insertion impedance produced by the activation and imperfections of the bypass circuitry.

Use of a function to bypass the low range portion of a wide range (maybe several orders of magnitude) current-to-voltage conversion system can reduce the insertion impedance of the current-to-voltage conversion system. This is good for mitigating possible error due to an increase in impedance of the total load on a source of current to be converted. Ideally, a current-to-voltage conversion circuit should introduce a zero insertion or burden impedance load on a source of the current to be converted to avoid possibly changing the current to be converted. Wide range current-to-voltage conversion circuits may include a bypass function of the low current-to-voltage conversion input circuitry that is activated when the converted current exceeds the upper limit of the low range. This bypass circuit will continue to load the conditioning current source with another series shunt resistance. This series shunt resistance is required to provide an input to the accompanying high range current-to-voltage conversion circuitry of the system.

A current-to-voltage conversion requirement mentioned in the foregoing, and that may be associated with undesirable measurement errors, supports an associated electrical energy measuring (kW-hr). One application is directed to a calibration standard product used to verify the calibration of electrical power meters, in widespread use by power utilities, by a process referred to as registration. A standard measures electrical energy by integrating converted instantaneous electrical power (kW) continuously over an interval of time that can be several seconds to several minutes or longer. The standard computes electrical power from converted electrical voltage and converted flow of electrical current. The meter under test simultaneously measures power using precisely the same voltage and current so that the meter and the standard energy outputs can be directly compared or registered. When registering a meter using customer load voltage and current, typically the voltage will not change by more than a few percent during an energy conditioning interval, but the current flow is somewhat likely to change greatly during an energy conditioning. Therefore, a current-to-voltage conversion method is needed that responds instantaneously to rapid and large changes in converted current and has a conditioning range that can extend over several orders of magnitude while maintaining conditioning accuracy to better than 0.1% of reading continuously throughout the conditioning interval.

SUMMARY OF INVENTION

Example embodiments of the present general inventive concept provide a saturation prevention method that utilizes transfer function modulation to continuously and precisely condition signals over more than four orders of magnitude from a signal source. To avoid signal conditioning error and large transient behavior due to range switching, continuous conditioning of all ranges without saturation over the entire large input dynamic range is employed. The signals may change by orders of magnitude during a conditioning period so the present general inventive concept enables precise continuous conditioning by preventing saturation of the conditioning regardless of large rapid changes in the magnitude of the signal.

Example embodiments of the present general inventive concept may be achieved by providing a signal conditioning circuit may include a forward module having a forward input to receive a forward input electrical signal and a forward output to output a forward output electrical signal, the forward module being configured to have a substantially instantaneous response and an inverting forward gain defined as a ratio of magnitudes of forward output electrical signals to forward input electrical signals, an input summation module including a first sum input coupled to a source of an electrical signal, a second sum input, and a total sum output coupled to the forward input of the forward module to produce the forward input electrical signal, and a reverse module including a reverse input and a reverse output, the reverse module being configured in anti-parallel with the forward module by coupling the reverse input to the forward output and by coupling the reverse output to the second sum input, and to have a substantially instantaneous response and a non-inverting reverse gain defined as a ratio of magnitudes of reverse output electrical signals to reverse input electrical signals, wherein the forward output electrical signal represents an analogue of the forward input electrical signal multiplied by the inverting forward gain when a magnitude of the forward output electrical signal is within a predetermined region of a linear operating range of the forward module.

Additional features and embodiments of the present general inventive concept will be set forth in part in the description which follows, and, in part, will be obvious from the description, or may be learned by practice of the present general inventive concept.

BRIEF DESCRIPTION OF THE FIGURES

The following example embodiments are representative of example techniques and structures designed to carry out the objects of the present general inventive concept, but the present general inventive concept is not limited to these example embodiments. In the accompanying drawings and illustrations, the sizes and relative sizes, shapes, and qualities of lines, entities, and regions may be exaggerated for clarity. A wide variety of additional embodiments will be more readily understood and appreciated through the following detailed description of the example embodiments, with reference to the accompanying drawings in which:

FIGS. 1A-1B illustrate an example embodiment of a handheld field testing device for the electric utility industry according to the present general inventive concept;

FIGS. 6A-6E illustrate portions of waveforms corresponding to various signals encountered in the example embodiment of the continuous dual range current-to-voltage conversion circuit illustrated in FIG. 5.

DETAILED DESCRIPTION

Figure 2:
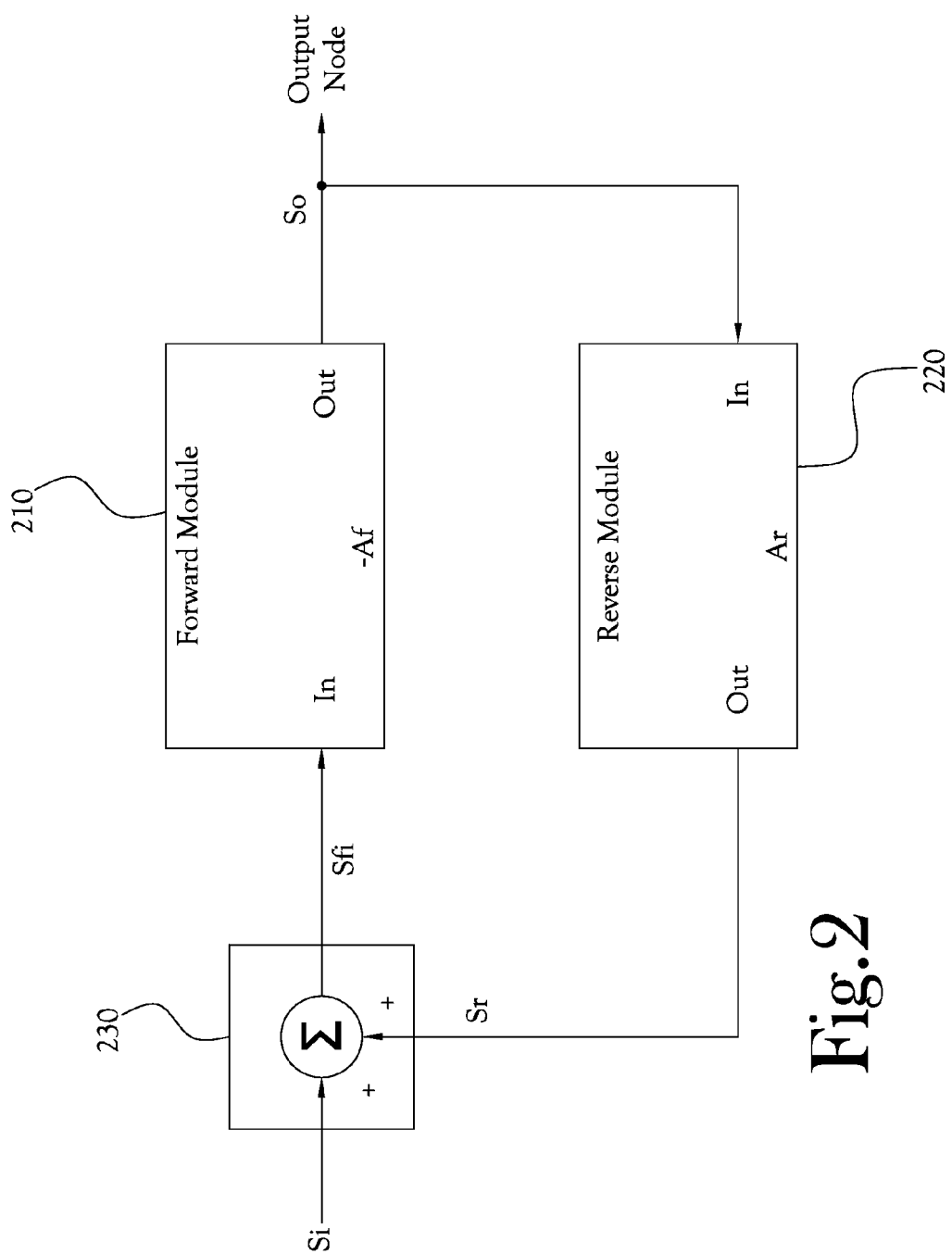
FIG. 2 illustrates a block diagram of various components of a signal conditioning circuit according to an example embodiment of the present general inventive concept.

Reference will now be made to the example embodiments of the present general inventive concept, examples of which are illustrated in the accompanying drawings and illustrations. The example embodiments are described herein in order to explain the present general inventive concept by referring to the figures.

The following detailed description is provided to assist the reader in gaining a comprehensive understanding of the structures and fabrication techniques described herein. Accordingly, various changes, modification, and equivalents of the structures and fabrication techniques described herein will be suggested to those of ordinary skill in the art. The progression of fabrication operations described are merely examples, however, and the sequence type of operations is not limited to that set forth herein and may be changed as is known in the art, with the exception of operations necessarily occurring in a certain order. Also, description of well-known functions and constructions may be omitted for increased clarity and conciseness.

Note that spatially relative terms, such as "up," "down," "right," "left," "beneath," "below," "lower," "above," "upper" and the like, may be used herein for ease of description to describe one element or feature's relationship to another element(s) or feature(s) as illustrated in the figures. Spatially relative terms are intended to encompass different orientations of the device in use or operation in addition to the orientation depicted in the figures. For example, if the device in the figures is turned over or rotated, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

As used herein, the term "resistor" may refer to an embodiment of a resistive element with a precisely designed opposition to the passage of electric current, as commonly used in the electronics industry and which would be readily recognized as a typical circuit component by one of ordinary skill in the art.

As used herein, the term "precision" resistor may refer to a resistor typically classified as EIA E192 (accuracy class 0.1% or better) with low TCR (±25 ppm/° C. or better), as commonly used in the electronics industry and which would be readily recognized as a typical resistor attribute by one of ordinary skill in the art.

As used herein, the term "op-amp" may refer to the embodiment of an ideal transistor circuit with a differential input (two inputs of opposite polarity), infinite input impedance, infinite open-loop gain, infinite bandwidth and zero noise, with a single output having zero output impedance, and typically available as a pre-manufactured integrated circuit. Op-amps may be combined with other electronic components to implement scaling transfer functions of less than unity (attenuator), greater than unity (amplifier), or unity (isolating buffer), in addition to other mathematical and utility operations on signals, as is commonly used in the electronics industry and which would be readily recognized as a typical electronic circuit component by one of ordinary skill in the art.

As used herein, the term "equivalent resistances" may refer to resistors having specified nominal values which would produce a ratio of unity if the resistances were ideal (i.e., zero error between the nominal specified and absolute resistance values), as is commonly used in the electronics industry and which would be readily recognized as a typical electronic circuit attribute by one of ordinary skill in the art.

As used herein, the term "sensitivity" may refer to a quantity specified by the amount of change in the output signal of a module due to at least one received input signal of that module. Effectively, the sensitivity is the ratio of the output signal of a given module divided by at least one input signal of the same module such that the sensitivity is substantially equivalent to a transfer function, gain, or attenuation of that module.

As used herein, the term "module" may refer to a portion of a circuit containing various electrical components to act on one or more signals. Different modules of a same circuit described herein may have one or more overlapping portions with other described modules.

As used herein, the term "condition" may refer to one or more changes to one or more attributes of an input signal, such that the "conditioned" output signal has the one or more changed attributes.

As used herein, the term "magnitude" may refer to the absolute value of a signal characteristic, such that the characteristic has a positive value whether the signal is in a positive or negative state.

It is noted that several of the example embodiments described herein may refer to voltage or current as the input and/or output signals being conditioned, measured, and so on. However, the conditioning methods and circuits described herein are not limited to either voltage or current, but rather are capable of conditioning and/or measuring a plurality of types of signals. Also, while the terms "resistor", "resistive elements", etc., are typically used in the following description, it is understood that such terms are interchangeable with "impedance" in the present general inventive concept.

As will be discussed in more detail herein and in regard to the drawings, various example embodiments of the present general inventive concept may be achieved by providing a saturation prevention signal conditioning method including a forward arrangement circuit, an input summation function circuit, an overall output, and a reverse arrangement circuit for substantially instantaneously converting without saturation an input electrical signal to a forward output electrical signal over a range of several orders of magnitude. The saturation prevention signal conditioning method may virtually zero an insertion impedance on a source of current to be converted.

Example embodiments of the present general inventive concept may be achieved by providing a current-to-voltage conversion system including a circuit to be used in a handheld field testing device, the circuit having a plurality of cascaded amplifiers in parallel with feedback including a plurality of active and passive elements to provide a virtually zero burden on a secondary side of a current transformer (CT).

An example embodiment of the present general inventive concept may herein be referred to as the saturation prevention signal conditioning methods. The saturation prevention signal conditioning methods may overcome one or more of the issues of excessive insertion impedance, excessive burden impedance, range changing transient generation, and low range output cut-off that are exhibited by commonly used wide range current-to-voltage conversion systems including methods to bypass low range current-to-voltage conversion circuitry when the level of converted current exceeds the top of the low range.

This may be demonstrated by an example embodiment including a composite arrangement of amplifiers and passives (without switches and their accompanying undesirable transients) in a novel linear negative feedback circuit arrangement that prevents saturation of an amplifier that produces the system output representing the converted current. Thusly, saturation prevention signal conditioning method automatically controls the transfer function as necessary to keep the conditioning system output within its linear operating range over at least 5 orders of input current magnitude. The output voltage of the negative feedback circuit is an analogue of the input current scaled by the maximum transimpedance of the circuit. This circuit has an accuracy of 0.1% or better whenever the peak current input produces a peak voltage output within ~80% of the amplifier peak output voltage linear operating range. The lower two orders of peak input current magnitude produce a peak output voltage that remains just within the 80% of the operating range and therefore is a precise analogue of the input current with better than 0.1% of reading accuracy. At the top of the second order of magnitude input current where the peak output voltage is near 80% of its linear operating range, a further increase in input current magnitude will cause the transimpedance to drop as required to keep the peak output signal magnitude well within the last 20% of the operating range of the amplifier peak voltage output. This modulation of the conditioning system transimpedance keeps the output responsive, unsaturated, and meaningful as the input current increases over 3 orders of magnitude beyond the lower 2 orders of magnitude of the current input range.

The saturation prevention signal conditioning method has an output voltage that is an analogue of the input current scaled by either the maximum or modulated transimpedance over the full 5 orders of input current magnitude. In an example embodiment, when the instantaneous voltage output of the conditioning system is within, for example, 80% of its peak operating range, the conditioning system transimpedance is at a maximum value and does not change regardless of input current magnitude. In the case of an alternating current input with magnitude above the lower 2 orders of magnitude range, the conditioning system transimpedance will drop below and then return to the maximum value 2 times during each period of the current waveform; i.e., during portions of the current waveform period in the vicinity of zero-crossings, the transimpedance remains at its maximum value. Therefore, the conditioning system voltage output will be an analogue of the input current scaled by the maximum transimpedance during the periods of time when the voltage output is within the first 80% of the peak operating range both above and below the zero crossings.

For example, if the input current waveform is sinusoidal with fundamental frequency, fic, then the RMS amplitude, Vic, of the fundamental of the waveform can be computed with a conditioning of the waveform zero-crossing slope, szc, using the expression $$Vic = \frac{szc}{\sqrt{2} \cdot 2 \cdot \pi \cdot fic}$$

The above relationship assumes that the magnitude of the fundamental of the converted alternating current waveform is larger than harmonics that could also be contained in the waveform such that the waveform exhibits only 2 zero-crossings per period. Essentially, the transimpedance of the saturation prevention signal conditioning method is only modulated (reduced) from the maximum value when the peak output voltage is in the last 20% of its operating range.

Example embodiments of the present general inventive concept may be achieved by providing a transimpedance current-to-voltage conversion circuit including a current transformer to transform an input primary current into a secondary current, a composite arrangement of amplifiers and passives, wherein the combined gain of the cascaded amplifiers directs substantially all of the secondary current through the feedback resistor.

The composite arrangement of amplifiers may be a first and second operational amplifier, wherein an inverting input of the first amplifier is connected to the current transformer, a non-inverting input of the second amplifier is connected to the output of the first amplifier, and an output voltage signal is supplied at an output of the second amplifier. The value of the secondary current may be derived from the relationship of the output voltage signal and resistive value of the feedback resistor which determines the transimpedance of the CT current-to-voltage conversion system. The current transformer may be a magnetic core engineered to have high permeability and low loss with a first predetermined number of windings representing a primary side, and a second predetermined number of windings on a secondary side.

Example embodiments of the present general inventive concept may also be achieved by providing a current-to-voltage conversion circuit including a continuous dual range current-to-voltage conversion circuit and a current transformer to transform an input primary current into a secondary current, the current transformer having primary and secondary windings, a first transimpedance current-to-voltage conversion circuit configured to be connected to a first end of the secondary winding and to output a first voltage output signal, a saturation prevention signal condition method circuit configured to be connected to a second end of the secondary winding and to output a second voltage output signal, wherein the first voltage output signal is used to convert current from the current transformer in a first range of current values, the second voltage output signal is used to convert current from the current transformer in a second range of current values, and the first and second voltage output signals are each output continuously and do not saturate over 5 orders of magnitude range of input current to be converted.

The first transimpedance current-to-voltage conversion circuit may include a first plurality of amplifiers configured in parallel with a first feedback resistor, the saturation prevention signal conditioning method may include a composite arrangement of amplifiers and passives (without switches and their accompanying undesirable transients) in a negative feedback circuit arrangement that prevents saturation of the amplifier that produces the system output representing the converted current, and the saturation prevention circuit transimpedance-setting feedback resistor may be of a larger value than the first feedback resistor. The saturation prevention signal conditioning circuit feedback resistor may have a value approximately two orders of magnitude larger than the first feedback resistor. The first transimpedance current-to-voltage conversion circuit may be used to convert current in a first range, and the saturation prevention signal conditioning circuit is used to convert current in a second range lower than the first range. The second range may include two orders of magnitude of conditioning, and the first range includes greater than two higher orders of magnitude of conditioning.

The second transimpedance current-to-voltage conversion circuit may include saturation prevention circuitry to prevent the second plurality of amplifiers from saturating when the secondary current is above a predetermined value. The second transimpedance current-to-voltage conversion circuit may include a second plurality of amplifiers configured in parallel with a second feedback resistor to output the second voltage output signal, and the saturation prevention circuitry may include a first saturation prevention amplifier configured to be connected to the second plurality of amplifiers with a first reverse resistor in between the first saturation prevention amplifier and the second plurality of amplifiers, the first saturation prevention amplifier having a third feedback resistor with a value higher than the first reverse resistor such that an output of the first reverse resistor will have a higher maximum value than the second voltage output signal.

The saturation prevention circuitry may include a second saturation prevention amplifier configured to be connected to the first saturation prevention amplifier and having a fourth feedback resistor such that a reverse current moves through the fourth feedback resistor in response to saturation of the first saturation prevention amplifier, the reverse current combining with a non-reverse current moving through the second feedback resistor to form the secondary current. The saturation prevention circuitry may include an antiparallel diode pair between the second saturation prevention amplifier and the secondary windings to block unwanted error signals from entering the saturation prevention circuitry when the secondary current does not exceed the second range of current values.

FIGS. 1A-1B illustrate an example embodiment of a handheld field testing device for the electric utility industry according to the present general inventive concept. Various example embodiments of the handheld field testing device 100 may include one or more of the circuits discussed herein used to analyze voltage, current, and/or other aspects associated with electric utilities. While the term "analyze" may be used herein when describing such devices and circuitry, it is understood that such a term may encompass various aspects of signal analysis, such as measurement, which in turn may encompass various types of conditioning, such as signal amplification to change the level of a signal to a more manageable value for, for example, measurement of the signal.

It is understood that the device 100 illustrated in FIG. 1 is merely an example embodiment configured with components to perform one or more of the analyses and/or processes described herein. However, it is understood that the present general inventive concept is not limited to any of the specific elements and/or configurations shown in this or other example embodiments in this description. The drawings described herein include several example embodiments of circuits and equivalent circuits that may be features in the device 100, or a differently configured device according to the present general inventive concept. Such a device may be battery powered, and/or may include an auxiliary power connection.

Several aspects and features of the analog "front-end" circuit designs according to various example embodiments of the present general inventive concept and described herein are either novel outright or, at least, novel as applied within a power standard for the electric power industry. One advantage of such an instrument is to provide power utility companies a cost-effective means of verification of power meters at power customer load points all over the world, regardless of the climate and various other conditions.

The example embodiment of the handheld field testing device 100 illustrated in FIGS. 1A-1B includes a face portion illustrated in FIG. 1A, and a connectivity portion illustrated in FIG. 1B. In the example embodiment illustrated in FIGS. 1A-1B, the face portion and connectivity portion are configured as adjacent surfaces, but it is understood that the present general inventive concept is not limited to such a configuration. For example, the connectivity portion of the device 100 may be configured to be opposite to the face portion, and so on. Further, although various user interactivity features and components are illustrated as being provided on and/or through the face portion of the device 100 in FIG. 1A, it is understood that the illustrated features and/or components may be provided at a plurality of surfaces, sides, etc., of the device 100 according to various example embodiments of the present general inventive concept.

The example embodiment of the face portion of the device 100 of FIG. 1A includes a plurality of user interface keys used to input data, control functionality, etc. The user interface keys may be configured in a variety of ways, such as mechanical buttons, heat or pressure sensors, and so on. In the example embodiment illustrated in FIG. 1A, the user interface keys include an alphanumeric key set 102 used to enter various characters related to data input, and to control an associated curser (space, backspace, etc.), an operational key set 104 used to control various operations of the device 100, and a functional key set 106 used to choose various functions of the device 100. The device 100 of the example embodiment illustrated in FIG. 1A also includes a display 108 to display alphanumeric and/or graphic results of various processes, fields of data entry, and so on. For example, in the embodiment illustrated in FIG. 1A, the display 108 is displaying a vector diagram associated with a three-phase voltage analysis operation. Such a display may include any of a number of values associated with such an operation, and has been simplified in FIG. 1A for ease of understanding.

The example embodiment of the connectivity portion of the device 100 of FIG. 1A includes a plurality of connection ports to connect the handheld device 100 with one or more other devices. Although not illustrated, the handheld device 100 may also be configured to communicate wirelessly by including one or more wireless communication transceivers to communicate in a standard such as Wi-Fi, Bluetooth®, etc. The connection ports may include, for example, direct inputs for AC current, AC voltage, and auxiliary power, various probe inputs, and various other connections such as pulse inputs and pulse outputs, USB ports for peripheral devices and/or connectivity to a PC, an RS232 port for legacy devices, and so on. The example embodiment illustrated in FIG. 1B includes direct inputs 110 for three-phase input of AC current and/or voltage, an RS232 port 120, and a plurality of USB ports 130, as well as other connections such as those discussed above.

Various example embodiments of the handheld device 100 provide a compact handheld design having a low weight, such as, for example, approximately 3.5 pounds, that is capable of protecting revenue in the electric utility industry by performing a host of functions such as diagnosing metering site errors. Example embodiments of the device 100 to perform waveform analysis include an ultra-compact, handheld field instrument with a true three-phase analyzing reference standard that performs various metering site accuracy tests, and operates under actual customer load conditions so a true representation of site accuracy can be verified. Various operations such as, for example, meter testing, CT/PT ratio testing, CT/PT burden measurement, register/demand testing, wiring verification, as well as other operations are all easily performed with the handheld device 100. Various example embodiments of the handheld device 100 may include the three-phase reference standard and may display vector diagrams, voltage and current waveforms, harmonic analysis up to $50^{th}$ harmonic, meter testing, and register/demand testing. Various example embodiments may include meter site manager software. Various example embodiments may include direct inputs 110 that are rated from 1 mA to 20 A RMS or 20 mV to 600V RMS, may include CT and PT ratio testing, and CT and PT burden measurement. Various example embodiments may include one or two sets of three probe inputs, wherein resolution and range are determined by probe. Various example embodiments may include an auxiliary power connection having 1 input rated 120 to 240 VAC. The pulse inputs may include a meter pulse input and standard input, and the pulse outputs may include a standard output. Various example embodiments may have a display resolution of 640×480, full color transmissive VGA, LED backlit, with a display size of approximately 5.7 inches. The operating temperature for various example embodiments of the device may be −20 degrees Celsius to 50 degrees Celsius, with a storage temperature of −30 degrees Celsius to 60 degrees Celsius, and in a non-condensing humidity of 0 to 95%. Various example embodiments may include an 11.1V Li-Ion rechargeable, 2600 mAh internal battery. Various example embodiments may have dimensions of approximately 11.6 in×6.2 in×2.0 in. The measurement category of the device 100 may be CAT IV 600V. Various example embodiments of the device 100 may measure energy in Wh, VARh, and Vah with a ±0.05% accuracy with direct current channels and ±0.10% accuracy with probe channels, power in Watt, VAR, and VA with a ±0.05% accuracy with direct current channels and ±0.10% accuracy with probe channels, and have a power factor of −1.00 to 1.00. As previously discussed, various example embodiments may measure harmonics in a user selectable fashion up to $50^{th}$ harmonic.

During an ac energy conditioning with a customer load, the current being converted can exhibit large, rapid changes in magnitude. Example embodiments of present general inventive concept enable precise conditioning of current regardless of the order of magnitude of the input or how much the input current changes within the conditioning period. One aspect that compelled various example embodiments of the present general inventive concept is the desire to accurately and continuously condition over greater than four decades of current using a single current transformer. In various example embodiments there may be two bipolar, alternating-current conditioning channels used with one current transformer (CT) to condition a primary-side current. To achieve the amount of required more than four decades of dynamic range, two ranges may be implemented, a high range 702 and a low range 704. The high range may be used from a maximum allowable input signal to some predefined value, while the low range may be used from a minimum allowable input signal to a different predefined value that is beyond the other predetermined value. This overlap in ranges will ensure accurate operation at all desired inputs. The current flowing in the CT secondary will be substantially identical for both inputs. In addition, both ranges are continuously and simultaneously conditioned, which eliminates the need for the use of switches to bypass a range or change from one range to another. The usage of switches is avoided to achieve the required dynamic range and prevents large switching and loading transients that can cause overall conditioning error when continuously conditioning current across the switchover point from one range to another.

FIG. 2 illustrates a block diagram of various components of a signal conditioning circuit according to an example embodiment of the present general inventive concept. The block diagram illustrated in FIG. 2 shows various signals that are input/output to/from the illustrated forward module 210, reverse module 220, and summing module 230. All signals associated with the example embodiment of FIG. 2 are electrical signals that can be either voltage or electrical current type signals. An input electrical signal Si from a signal source is an input to be conditioned, and is applied to a first input of a summing module 230. The summing module 230 has a total sum output which substantially instantaneously produces a forward input signal Sfi that is applied to the input of the forward module 210. The forward module 210 has an output that substantially instantaneously produces a forward output signal So which is applied to a reverse input of the reverse module 220 which has a reverse output that substantially instantaneously produces a reverse output signal Sr that is applied to a second sum input of the summing module 230. The forward output signal So has a forward sensitivity −Af to the forward input signal Sfi such that −Af=−(So/Sfi) where Af is negative to represent an inverting sensitivity. The reverse output signal Sr is generated only when the forward output signal So magnitude exceeds a threshold value representing a predetermined percentage of the linear operating range of the forward output of the forward module 210. The reverse output signal Sr has a reverse sensitivity Ar to a difference signal ΔSo determined by the difference between the forward output signal So and the threshold value such that Ar=Sr/ΔSo where Ar is positive to represent a non-inverting sensitivity. Another example embodiment may have a configuration that produces conditioning where the forward output So is generated in-phase with the input electrical signal Si, and such that Af is positive (non-inverting) and Ar is negative (inverting). Regardless, the reverse output signal Sr will be inverted with respect to the input signal Si and thereby subtract substantially instantaneously from the input signal Si producing the forward input signal Sfi smaller than the input signal Si when Sr is non-zero corresponding to a forward output signal So greater than the threshold value. The net conditioning result is that the output forward output signal So of this example embodiment is determined substantially instantaneously by the input signal Si multiplied by the forward sensitivity Af when the forward output signal So magnitude is less than the threshold value. When the forward output signal is greater than or equal the threshold value, the net conditioning result is that the embodiment output forward output signal So is determined by the input signal Si multiplied by a parallel combination of Af and 1/Ar; i.e., the present example embodiment input-to-output transfer function is equal to 1/(Ar+1/Af) when the forward output So is in the upper region of the linear operating range of the forward output. Careful choice of the reverse sensitivity Ar and the threshold value representing a point in the predetermined percentage of linear operating range can prevent saturation of the forward output that produces the forward output signal So.

Figure 3:
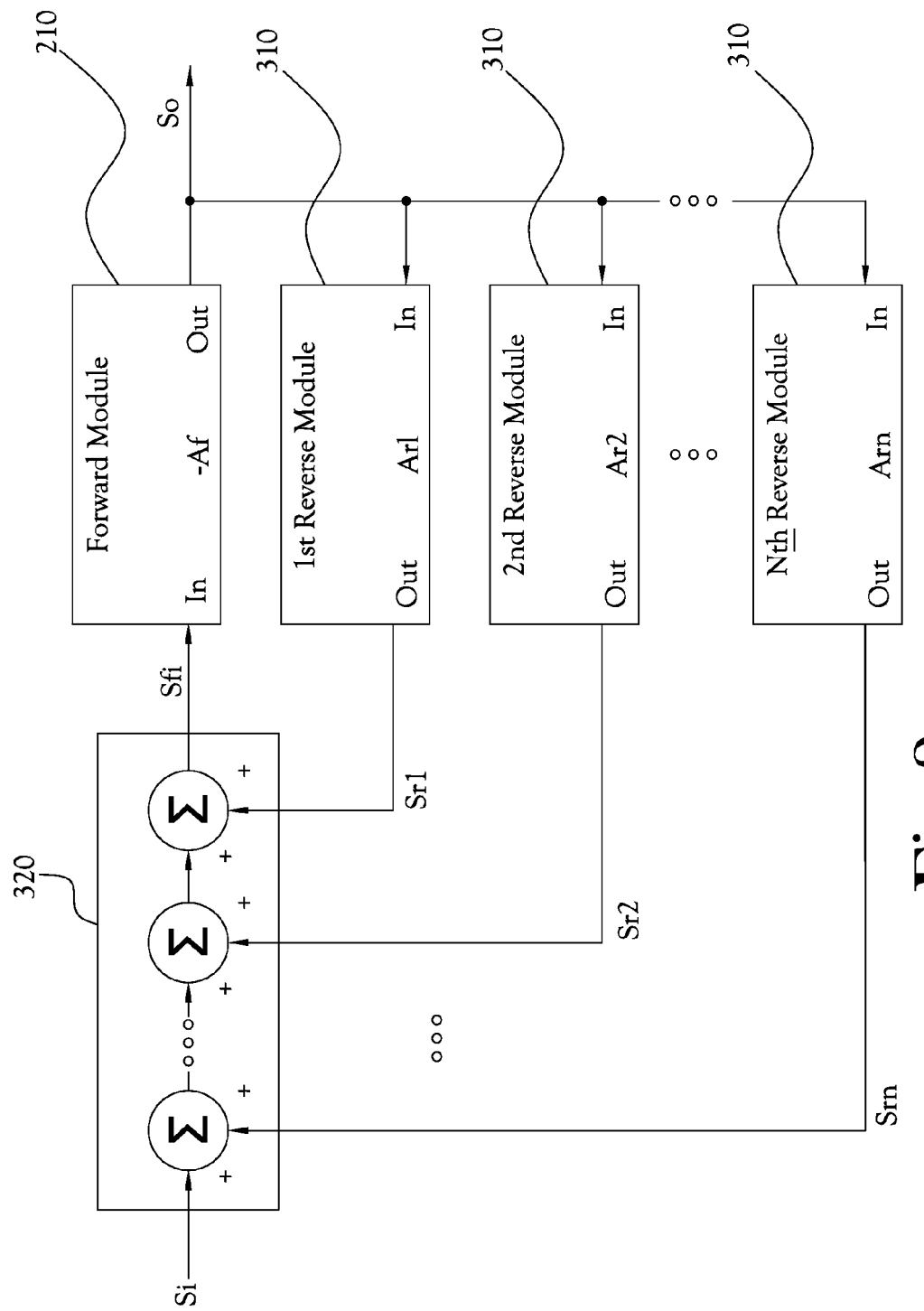
FIG. 3 illustrates a block diagram of various components of a signal conditioning circuit according to another example embodiment of the present general inventive concept.

Other various example embodiments of the present general inventive concept may include a natural expansion of the embodiment illustrated in FIG. 2. For example, FIG. 3 illustrates a block diagram of various components of a signal conditioning circuit according to another example embodiment of the present general inventive concept. The example embodiment illustrated in FIG. 3 produces a similar change to the input-to-output transfer function illustrated in FIG. 2, except for the use of multiple reverse modules 310. The use of multiple reverse modules produces an equal number of multiple threshold values, each corresponding to an increasing forward output signal So magnitude such that all are predetermined to be within the linear operating range of the forward output of the forward module. Each reverse output of each reverse module 310 produces a reverse output signal driving its own summing input to the summing module 320. The reverse inputs of all reverse modules 310 are driven by the forward output signal So which remains the conditioned embodiment output. The net conditioning result is similar to the previous embodiment except there is a different input-to-output transfer function for each reverse module 310 employed. As threshold values are exceeded by the forward output signal So magnitude (increasing from So1 to So2 to . . . So[n]), the input-to-output transfer function or gain that produces the forward output signal So due to the input signal Si changes from Af to 1/(Ar1+1/Af) to 1/(Ar1+Ar2+ 1/Af) and so forth ending up equal to 1/(Ar1+Ar2+ . . . +Ar[n]+1/Af) where n is equal to the number of reverse modules.

Figure 4:
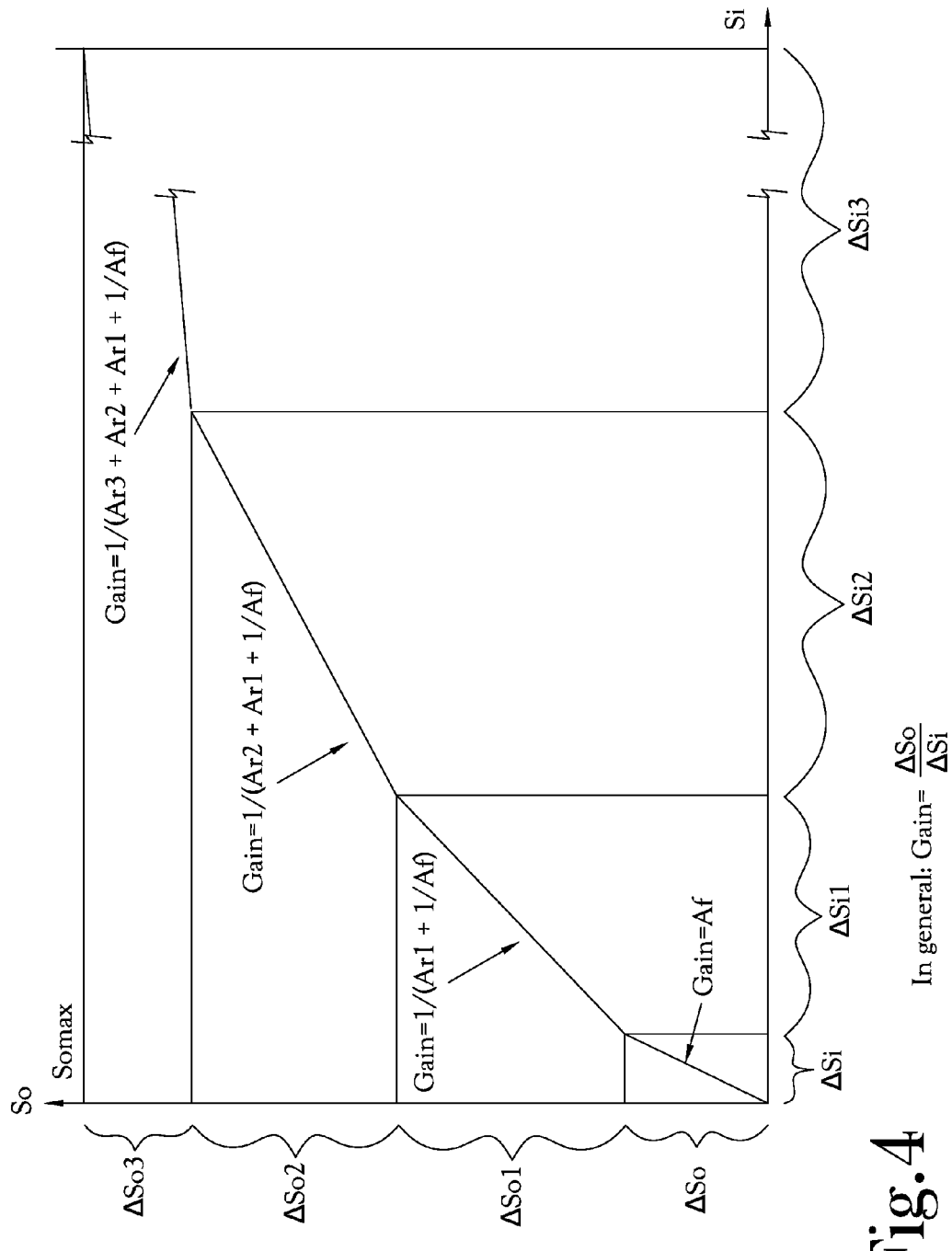
FIG. 4 illustrates a gain and output signal response according to changes in an input signal magnitude in the example embodiment circuit illustrated in FIG. 3.

FIG. 4 illustrates a gain and output signal response according to changes in an input signal magnitude in the example embodiment circuit illustrated in FIG. 3. FIG. 4 shows the FIG. 3 embodiment input-to-output relationship for n equal to 3 reverse modules by plotting the forward output So versus the input signal Si. At each point where the forward output signal So magnitude substantially instantaneously exceeds a reverse module threshold value, a different transfer function or gain is created for the embodiment input-to-output relationship indicated in FIG. 4 as a decrease in the slope of the line relating the forward output signal So to the input signal Si.

Herein, all referenced impedances and transfer functions, including transimpedances, are functions of the complex frequency variable "s" from the Laplace Transform. This may also be referred to as a representation of the s-domain function.

Figure 5:
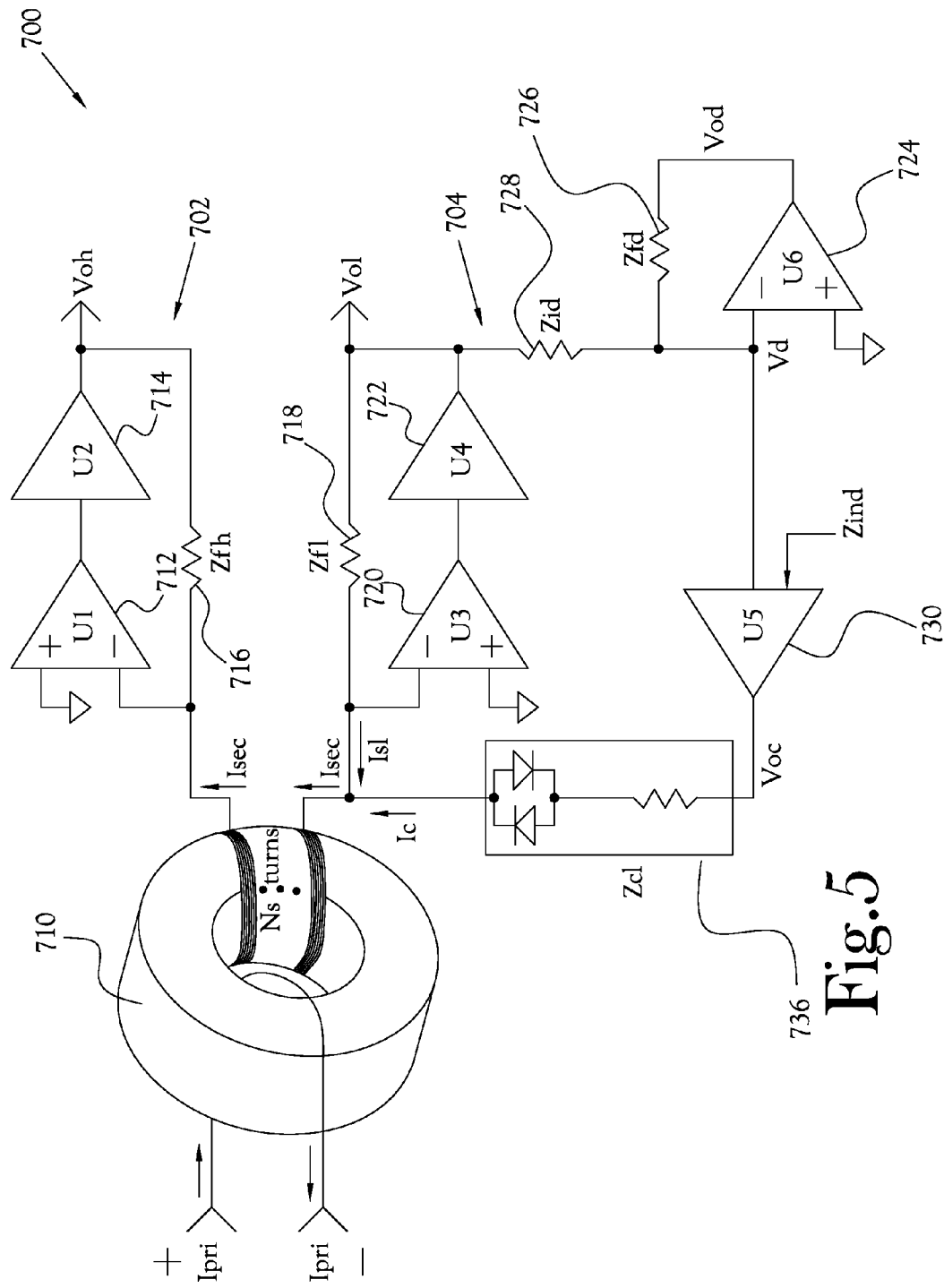
FIG. 5 illustrates a signal conditioning circuit used for continuous dual range current-to-voltage conversation with saturation prevention according to yet another example embodiment of the present general inventive concept.

FIG. 5 illustrates a signal conditioning circuit 700 used for continuous dual range current-to-voltage converstion with saturation prevention according to yet another example embodiment of the present general inventive concept. The example embodiment illustrated in FIG. 5 includes a circuit portion 704 configured as a low range circuit to convert the current Isec in a CT 710 secondary to voltage signals suitable for analog-to-digital conversion such that saturation of the low range output cannot occur. Also included and described is a high range circuit portion 702 for conversion of the same CT 710 secondary current Isec. Ipri indicates the current through the primary winding of the CT 710.

For the high range 702, the secondary CT current Isec is converted to a voltage signal Voh by the transimpedance of an amplifier circuit Zh. The main advantage of using a transimpedance amplifier configuration is to obtain a substantial amount of signal gain while maintaining a substantially zero burden impedance, and therefore voltage, presented to the CT secondary. This voltage on the CT 710 is typically minimized to minimize errors through the transformer due to inherent, internal losses and to avoid saturation of the core. In addition, this increase in the current-to-voltage gain while keeping the loading on the CT secondary substantially zero greatly improves the SNR. For frequencies of interest, the high-range transimpedance Zh can be closely approximated by the negative of the s-domain representation of the closed-loop feedback impedance Zfh 716. This impedance may include a parallel combination of a high-range feedback resistor Rfh and feedback capacitor Cfh (not shown). When signals into the high range are smaller than the predetermined input range, the gain is no longer adequate to maintain an acceptable amount of SNR for the desired accuracy of the conditioning circuit. Regardless of the input signal level that is within the dynamic range of all inputs, the high-range amplifier always operates linearly with the transimpedance Zh shown below. The overall conditioning accuracy and temperature sensitivity of the high-range conditioning circuit are dominated by the initial resistance tolerance and the temperature coefficient of resistance of Rfh. High-range circuit performance can be optimized for conditioning accuracy and low temperature sensitivity by using a precise resistive component with a low temperature coefficient of resistance.

$$Zh(s) \sim -Zfh(s) = \frac{-Rfh}{1 + s \cdot Rfh \cdot Cfh}$$

A substantial current-to-voltage gain should not present a load to the CT secondary that is large enough to create a voltage across the transformer that will result in additional errors and core saturation. In the example embodiment illustrated in FIG. 5, a second gain stage U2 714 with gain A2 is cascaded with the gain A1 of the first amplifier U1 712 to further decrease the input impedance of the transimpedance conditioning circuit and ultimately the overall loading of the CT secondary. An increase in the effective open-loop gain will also result in the above approximation for the high-range transimpedance to more closely follow the fully modeled design equation derived from analysis with no approximations. This additional gain will increase the possibility for instability in the circuit requiring additional stability analysis and possibly compensation. For all frequencies of interest, the contribution to the input impedance of the cascaded gains of the high range is assumed to be much greater than the contribution of its input node capacitance Cnh, so the loading contribution of the high-range circuit Zinh can be shown as the following:

$$Zinh(s) \sim \frac{Zfh(s)}{1 + A1(s) \cdot A2(s)} \quad \text{Assumption:} \quad 1 + A1(s)A2(s) \gg s \cdot Cnh \cdot Zfh(s)$$

For the low range circuit portion 704, the secondary CT current Isec is similarly converted to a voltage signal Vol by a transimpedance amplifier circuit. For frequencies of interest when input signals are within the predetermined range for the low range, the low-range transimpedance Zl can be approximated by the s-domain representation of the closed-loop feedback impedance Zfl 718, just as with the high range. The transimpedance is shown below including the parallel combination of the low-range feedback resistor Rfl and feedback capacitor Cfl (not shown). Just as with the high range, the overall conditioning accuracy and temperature sensitivity of the low-range conditioning circuit are dominated by the initial resistance tolerance and the temperature coefficient of resistance of Rfl. Low-range circuit performance can be optimized for conditioning accuracy and low temperature sensitivity by using a precise resistive component with a low temperature coefficient of resistance.

$$Zl(s) \sim Zfl(s) = \frac{Rfl}{1 + s \cdot Rfl \cdot Cfl}$$

Just as with the high range, the low range has a second gain stage U4 722 with gain A4 that is cascaded with the gain A3 of the third amplifier U3 (720). This additional gain will further decrease the input impedance of the transimpedance conditioning circuit and ultimately the overall loading of the CT secondary. As in the high-range, the approximated low-range transimpedance expression will be closer to the ideal expression when there is an increase in the effective open-loop gain. As before, this additional gain will increase the possibility for instability in the circuit requiring additional stability analysis and possibly compensation. For all frequencies of interest, the contribution to the input impedance of the cascaded gains of the low range is assumed to be much greater than the contribution of its input node capacitance Cnl, so the loading contribution of the low-range circuit Zinl can be shown as the following:

$$Zinl(s) \sim \frac{Zfl(s)}{1 + A3(s) \cdot A4(s)} \quad \text{Assumption:} \quad 1 + A3(s)A4(s) \gg s \cdot Cnl \cdot Zfl(s)$$

In the present example embodiment, the high range circuit portion 702 is designed such that no input signal level of interest should cause that range to operate outside of its linear region. Signals smaller than intended for the high range will continue to operate properly within the linear range of the amplifier circuit but will have a much smaller SNR than desired for good signal conditioning results. The low range conditioning circuit 704 gain is optimized for adequate SNR at the lowest desired input signal level. The low range transimpedance needs to be much larger than that of the high range. When high range signal levels are applied to the low-range input, the low-range circuit should continue to operate without the amplifiers saturating. Unless provisions are made to accommodate this over ranging, when the input signal goes beyond the specified input range of normal operation, the low-range circuit output may become unresponsive to further increases in the input signal. If this happens, the circuit may then lose the ability to maintain a substantially zero voltage at the input node, resulting in current source loading and invalid output signals. In the case where a CT is the effective current source, this results in relatively large voltage signals on the CT secondary that contribute to conditioning errors, CT core saturation due to increased applied voltage, and possible interference with high-range conditionings. The effects from this saturation of the amplifier circuit can affect the overall circuit performance and should be mitigated for optimum operation. The example embodiment of FIG. 5 employs a circuit to provide saturation prevention by transimpedance modulation.

The saturation prevention circuit of 700 employs a novel feedback circuit to modulate the transimpedance of the low range portion 704 based on the current level presented to the input of the circuit. The non-saturated, closed-loop gain of U6 724 is approximately set by Zid 728 and Zfd 726 to establish what output voltage Vol will be required to begin to produce the saturation prevention effect of the circuit. At a predetermined Vol voltage, U6 will become saturated, and the U6 amplifier circuit will no longer be able to maintain the substantially zero voltage at the voltage node Vd as occurs in normal operation of the amplifier U6. The voltage signal created at Vd after U6 saturates is utilized, along with feedback, to provide the transimpedance modulation of the saturation prevention circuit.

The transimpedance modulation signal Vd is amplified by the gain A5 of U5 730 to provide a control voltage signal Voc. This control signal is applied across the Zcl impedance 736, providing an alternative path for input current to flow and become diverted in such a way that the output signal is minimally increased with further increases of the input current. This prevents the forward-path amplifiers U3,U4 from saturating and effectively modulates the circuit's transimpedance to the output Vol.

The Zcl impedance 736 can be the composite static and dynamic impedance of anti-parallel diodes with series impedance. The static portion of this impedance is mainly attributed to any components in series with the diodes, including static impedances internal to the diode. The saturation prevention circuit functions properly with only the static portion of this impedance to set the amount of current to be diverted. There are some added benefits of implementing this circuit with anti-parallel diodes. The dynamic portion of Zcl 736 is based on the typical p-n junction diode equation for current. This current is an exponential function of the applied voltage difference to the diodes between the voltage at the low-range input node, which is substantially zero, and Voc. Using the A5 amplification of Vd and anti-parallel diodes in this portion of the circuit provides noise insensitivity to the transimpedance modulation voltage Vd and by association, output offset insensitivity to the control voltage signal Voc. Output offset and noise insensitivity of these signals allows the transimpedance modulation circuitry to have virtually no effect on the normal low-range operation since there will be substantially zero volts across the anti-parallel diodes, restricting substantially all current flow through them. In normal operation of the low range, the saturation prevention circuit essentially only affects the low-range operation by causing a slight increase in the input capacitance of the circuit. As can be seen from the design equations above, the input capacitance has very little effect on the typical circuit operation at the frequencies of interest and is neglected. Although neglected for frequency response over the bandwidth of interest, these impedances must still be considered for stability analysis and compensation.

For a given AC input with an RMS value that exceeds the intended input range of the low range, the transfer function will be the transimpedance Zl shown above until the magnitude of Vol reaches a level that causes the U6 amplifier 724 to saturate. Once this occurs, additional increases in input current cause Vd to become non-zero, therefore increasing Voc, which begins to forward bias one of the anti-parallel diodes, depending on signal polarity. Current will then begin to flow through the diode as the input current, and consequently Voc, increases further. The output voltage Vol of the low-range circuit 704 will subsequently have the original transimpedance Zl for Vol up to the saturation prevention point and a different transimpedance Zlc applied to any additional increases of input current during the saturation prevention. The saturation prevention transimpedance Zlc will change exponentially with the additional input current magnitude since the dynamic diode impedance contained in the impedance Zcl, and ultimately Zlc, is a strong function of Voc. If an example embodiment is employed without the use of anti-parallel diodes, the transimpedance may then be based on the static portion of Zcl. In this case, the low-range transimpedance still operates as Zl to create the output voltage Vol until Vol is large enough to saturate U6 724. Once this occurs, all further increases in the input current will increase the output voltage Vol magnitude by a static saturation prevention transimpedance Zlc. So for any total input current, the portion of the input current within the predetermined limit where Vd is substantially zero and U6 724 is not saturated, those currents will experience the typical low-range transimpedance Zl. For any additional input current magnitude above the predetermined input levels, the transfer function for the saturation prevention transimpedance Zlc will be experienced by the additional input current to create additional output signal Vol that further increases the magnitude of the existing Vol from the typical low-range transimpedance Zl.

Below is the saturation prevention transimpedance Zlc comprised of the impedance Zd, the parallel combination of the U6 724 feedback impedance Zfd 726 and the U5 730 input impedance Zind when U6 724 is saturated. Also included in the transimpedance Zlc below is the impedance Zid 728, which is the series input impedance used to determine the closed-loop gain of U6 724 and the voltage division used to create Vd during saturation prevention. To obtain a simplified expression for Zlc, the effective output impedance contributed by the current source Zos is assumed to be much larger than the input impedance of the high range Zinh, and as before, Zl can be approximated by Zfl.

$$Zlc(s) \sim \frac{Zfl(s) \cdot Zcl(s)}{Zfl(s) \cdot \left(\frac{1}{A3(s) \cdot A4(s)} + A5(s) \cdot \frac{Zd(s)}{Zd(s) + Zid(s)}\right) + Zcl(s)}$$

Assumptions:

$Zos(s) \gg Zinh(s)$ $Zl(s) \sim Zfl(s)$

FIGS. 6A-6E illustrate portions of waveforms corresponding to various signals encountered in the example embodiment of the continuous dual range current-to-voltage conversion circuit illustrated in FIG. 5. In the instance of a purely sinusoidal input signal as illustrated in in FIG. 6A that exceeds the typical low range input levels, the resulting output of the low range will be a sine wave with flattened lobes, as illustrated in FIG. 6C due to the saturation prevention circuit modulating the transimpedance. The transimpedance modulation signal Vd will be substantially zero at all points in time except where the saturation prevention circuit is operating as illustrated in in FIG. 6D. The output signal of the high range will be a precise voltage representation, albeit inverted, of the input current as illustrated in FIG. 6B. FIG. 6E illustrates the output due to the saturation of U6 724. In this scenario, most of the signal content near the zero-crossing points is preserved and conditioned for conditioning, resulting in useful conditioning information from the low range while its input signal ranges outside of its typical dynamic range. Based on the signal processing done to the output signal of the low range under these conditions, useful pieces of information that can be extracted include but are not limited to the peak value of the fundamental current input or a very precise conditioning for the frequency of the fundamental signal.

In the present example embodiment the input impedance is also affected when the saturation prevention circuit modulates the circuit's transimpedance. As the effective transimpedance of the low range decreases, the input impedance of the low range that contributes to the source loading also decreases. The input impedance while the saturation prevention circuit is active is expressed below as Zinc.

$$Zinc(s) = \frac{Zfl(s) \cdot Zcl(s)}{Zfl(s) \cdot \left(1 + A3(s) \cdot A4(s) \cdot A5(s) \cdot \frac{Zd(s)}{Zd(s) + Zid(s)}\right) + Zcl(s) \cdot (1 + A3(s) \cdot A4(s))}$$

In the present example embodiment where a CT is used with both a high range and a low range circuit portion, the composite loading of the both ranges must be considered since both ranges are conditioning continuously. During normal operation, the previously described burden impedance Zb includes the simple sum of both input impedances Zinh and Zinl. When the saturation prevention by transimpedance modulation is occurring, the burden impedance Zb includes the simple sum of Zinh and Zinc. Although very small at frequencies of interest, Zinl is the largest burden impedance of the possible burdens in the present example embodiment due to the large amount of transimpedance the circuit provides. The input impedance Zinl is only presented as a load on the current source when the input current magnitudes are in the lower portion of the full dynamic range of both channels. This means that core saturation and core losses due to applied voltage are minimized with this somewhat larger loading since the voltage created across the core will remain very small due to the small currents being conditioned. Once the input current reaches a point outside of the low range dynamic range, the dominant current source loading is Zinh since Zinc will be lower impedance than the other two input impedances combined. During typical high range operation, the loading contribution from the low range will change with signal level between Zinl and Zinc. This change is small and will cumulatively have negligible effects (on the order of parts per million) on the conditioning accuracy of the present example embodiment.

Various example embodiments of the present general inventive concepts may include circuits that are not used with a CT. Instead, these circuits may be directly connected, for example, in series into an electrical current source and load circuit for the purpose of conditioning a load current. Connection into any point within a current source and load circuit is made possible by providing DC power to the saturation prevention low range circuit that is electrically isolated from the current source and load circuit potentials. A second electrically isolated DC power can be used to isolate a high range current conditioning circuit as well to provide dual range current conditioning.

The example embodiments described herein, and those not expressly outlined, utilize multiple negative feedback loops. In particular the saturation prevention feedback circuit is complex to analyze and optimize. As always in negative feedback circuit design, the performance of various example embodiments of the present general inventive concept may be optimized in cases in which the feedback loop is engineered for optimum speed and stability for proper function and minimum noise superposition onto the output to be digitized downstream. Such engineering is non-trivial as it comprises a strategic combination of experiment and theoretical analysis. That work is beyond the scope of this disclosure and, again, is not described here.

As discussed in reference to FIGS. 2-5, an example embodiment of the present general inventive concept may provide a saturation prevention electrical signal conditioning method for substantially instantaneously converting either a voltage or an electrical current type of an input electrical signal to a forward output electrical signal with good accuracy of reading over a range of several orders of magnitude without saturation including a forward signal conditioning including a forward input and a forward output configured to have a total forward gain-bandwidth product and an inverting forward gain defined as a ratio of magnitudes of forward output to forward input electrical signals, an input summation function with a first sum input coupled to a source of electrical signal and a total sum output coupled to the forward input of the forward signal conditioning, an overall output coupled to the forward output of the forward signal conditioning that produces the forward output electrical signal representing a conditioned instantaneous analogue of a forward input electrical signal multiplied by the inverting forward gain with good accuracy of reading when a range of magnitudes of the forward output electrical signal on the forward output is within a predetermined lower region of a linear operating electrical signal range of the forward output of the forward signal conditioning in both positive and negative senses, and a reverse signal conditioning including a reverse input and a reverse output configured to have a total reverse gain-bandwidth product and a non-inverting reverse gain defined as a ratio of magnitudes of reverse output to reverse input electrical signals, wherein the reverse signal conditioning is configured in anti-parallel with the forward signal conditioning by coupling the reverse input of the reverse signal conditioning to the overall output and by coupling the reverse output of the reverse signal conditioning to a second sum input of the input summation function, wherein the output of the input summation function produces the forward input electrical signal thereby applied to the forward input, wherein the first sum input of the input summation function exhibits an input impedance that is either substantially zero ohms if the input electrical signal is an input electrical current signal or substantially infinite ohms if the input electrical signal is an input voltage signal such that the input electrical signal is processed by the first sum input with substantially zero dissipation of electrical power from the source of electrical signal, wherein the reverse signal conditioning is configured such that the reverse output of the reverse signal conditioning begins to produce a reverse output electrical signal only when the forward output electrical signal on the overall output just exceeds an upper signal magnitude set by the predetermined lower region of the linear operating electrical signal range in both positive and negative senses, wherein the reverse signal conditioning is also configured such that the reverse output electrical signal increases in proportion to a forward output difference electrical signal magnitude defined as the upper signal magnitude subtracted from the forward output electrical signal in both positive and negative senses, wherein the reverse output electrical signal is equal to the forward output difference electrical signal multiplied by the non-inverting reverse gain, wherein the reverse output electrical signal, when non-zero, subtracts from the input electrical signal due to both the input node summation function and the inverting forward gain thereby reducing further increase of the forward input electrical signal on the output of the input summing function, wherein the forward output electrical signal is the conditioned instantaneous analogue of the input electrical signal multiplied by the inverting forward gain when the forward output electrical signal is within the predetermined lower region in both positive and negative senses of the linear operating electrical signal range of the forward output of the forward signal conditioning, and wherein changes in magnitude of the forward output electrical signal are equal to changes in magnitude of the input electrical signal divided by the sum the non-inverting reverse gain magnitude and of the reciprocal of the inverting forward gain magnitude whenever the forward output electrical signal is above the predetermined lower region in both positive and negative senses of the linear operating electrical signal range of the forward output of the forward signal conditioning, wherein the inverting forward gain and the non-inverting reverse gain produce the forward output electrical signal and the reverse output electrical signals, respectively, that are inverted relative to the input electrical signal.

Another example embodiment of such a saturation prevention electrical signal conditioning method may include the forward signal conditioning having a non-inverting forward gain to replace the inverting forward gain discussed above, and the reverse signal conditioning having an inverting reverse gain to replace the non-inverting reverse gain discussed above, wherein the non-inverting forward gain produces the forward output electrical signal non-inverted relative to the input electrical signal, and wherein the inverting reverse gain produces the reverse output electrical signal inverted relative to the input electrical signal.

The saturation prevention electrical signal conditioning method may include a plurality of N reverse signal conditioning sections replacing the reverse signal conditioning discussed above and having one each of a plurality of N predetermined overlapping lower portions, respectively, of the linear operating electrical signal range of the forward output of the forward signal conditioning section operation within thereof determined by the forward output electrical signal substantially instantaneous magnitude, an N+1 input summing function replacing the input summation function discussed above and having a plurality of N+1 sum inputs with a first sum input coupled to the source of electrical signal and a total sum output coupled to the forward input of the forward signal conditioning, wherein the total sum output of the N+1 input summing function generates the forward input electrical signal, wherein an $n^{th}$ corresponds to a specific element of a plurality of N set such that the least value of N is two and the maximum value of N is theoretically unlimited, wherein the value of N=1 produces the saturation prevention electrical signal conditioning method discussed above, wherein the plurality of N predetermined overlapping lower portions of the linear operating electrical signal range each extending from substantially zero to the $n^{th}$ of a plurality of N increasing upper signal magnitudes taken on by the forward output electrical signal in both the positive and negative senses, wherein the $n^{th}$ of the plurality of N reverse signal conditioning sections operation is respectively characterized by the $n^{th}$ of a plurality of N non-inverting reverse gains, wherein the $n^{th}$ of the plurality of N reverse signal conditioning sections generate the $n^{th}$ of a plurality of N reverse output electrical signals which is the conditioned instantaneous analogue of the forward output electrical signal multiplied by the $n^{th}$ of the plurality of N non-inverting reverse gains magnitude ONLY AFTER the forward output electrical signal magnitude exceeds respectively the $n^{th}$ of the plurality of N increasing upper signal magnitudes in both the positive and negative senses, wherein the forward output electrical signal is the conditioned instantaneous analogue of the input electrical signal multiplied by the inverting forward gain when the forward output electrical signal magnitude is less than or equal to a lowest magnitude of the plurality of N upper signal magnitudes in both the positive and negative senses, wherein changes in magnitude of the forward output electrical signal are equal to changes in magnitude of the input electrical signal divided by: (a) sum through the $n^{th}$ of the plurality of N non-inverting reverse gains magnitudes added to (b) the reciprocal of the inverting forward gain magnitude whenever the forward output electrical signal magnitude is greater than the $n^{th}$ and, if the $n^{th}$ is less than N, is less than the $n^{th}$ plus one of the plurality of N upper signal magnitudes in both positive and negative senses, and wherein the inverting forward gain and the non-inverting reverse gain produce the forward output electrical signal and the plurality of N reverse output electrical signals, respectively, that are inverted relative to the input electrical signal.

The saturation prevention electrical signal conditioning method may include the forward signal conditioning having a non-inverting forward gain to replace the inverting forward gain discussed above, and the plurality of N reverse signal conditioning having respectively a plurality of N inverting reverse gains to replace the plurality of N non-inverting reverse gains discussed above, wherein the non-inverting forward gain produces the forward output electrical signal non-inverted relative to the input electrical signal, and wherein the inverting reverse gain produces the plurality of N reverse output electrical signals that are inverted relative to the input electrical signal.

Another example embodiment of the saturation prevention electrical current signal conditioning system for substantially instantaneously converting without saturation a forward input electrical current to a forward output voltage with good accuracy of reading over a range of several orders of magnitude may include a forward plurality of amplifiers and passives configured in a forward arrangement including a forward last amplifier and a forward first amplifier configured to have a total forward gain-bandwidth product and an inverting forward gain defined as a ratio of magnitudes of forward output to forward input electrical signals, an input node coupled to both a source of electrical current to be conditioned and to a forward input of the forward first amplifier of the forward arrangement, an output node coupled to a forward output of the forward last amplifier within the forward arrangement that produces a forward output voltage representing a conditioned instantaneous analogue of the forward input electrical current produced by the source of electrical current with good accuracy of reading when a range of magnitudes of the forward output voltage on the output node is within a predetermined lower region of a linear operating voltage range of the forward last amplifier, a feedback impedance having a feedback magnitude coupled in parallel with the forward arrangement between the input node and the output node, a reverse plurality of amplifiers and passives configured in a reverse arrangement including a reverse last amplifier and a reverse first amplifier configured to have a total reverse gain-bandwidth product and a non-inverting reverse gain defined as a ratio of magnitudes of reverse output to reverse input electrical signals, a reverse impedance having a reverse magnitude coupled in series between a reverse output of the reverse last amplifier within the reverse arrangement and the input node, wherein the reverse arrangement is coupled in anti-parallel with the forward arrangement by coupling a reverse input of the reverse first amplifier of the reverse arrangement to the output node since the reverse impedance is coupled to the input node, wherein the total forward voltage gain-bandwidth product of the forward arrangement is sufficiently large to pull through the feedback impedance substantially all flow of either the forward input electrical current or a net forward input electrical current entering the input node such that the feedback magnitude of the feedback impedance substantially determines a maximum transimpedance that produces the forward output voltage on the output node responsive to either the forward input electrical current or the net forward input electrical current, wherein the reverse arrangement is configured such that the reverse output of the reverse last amplifier in the reverse arrangement does not produce a reverse output voltage until the forward output voltage on the output node exceeds the range of magnitudes corresponding to the predetermined lower region of the linear operating voltage range of the forward last amplifier, wherein the reverse impedance of the reverse arrangement has the reverse magnitude that is smaller than the feedback magnitude of the feedback impedance and converts the reverse output voltage of the reverse output of the reverse last amplifier to a reverse input electrical current flowing into the input node, wherein the reverse arrangement is also configured such that, after the forward output voltage on the output node exceeds the predetermined lower region of the linear operating voltage range of the forward last amplifier, both the reverse output voltage and thereby also the reverse input electrical current thereafter increase in proportion to the forward output voltage on the output node, and wherein the reverse input electrical current, produced as indicated by the forward output voltage exceeding the predetermined lower region of the linear operating voltage range of the forward last amplifier, combines with the forward input electrical current produced by the source of electrical current to create the net forward input electrical current thereby creating the forward output voltage responsive to the forward input electrical current such that a ratio of the forward output voltage to the forward input electrical current is a minimum transimpedance substantially equal to the reverse magnitude divided by the total reverse voltage gain when the feedback magnitude of the feedback impedance is much greater than the reverse magnitude of the reverse impedance. The reverse impedance may include a fixed impedance series coupled to an anti-parallel diode pair such that, when the forward output voltage on the output node is within the predetermined lower region of the linear operating voltage range of the forward last amplifier, a total noise and offset voltage generated by the reverse arrangement is substantially prevented from producing an unwanted noise and offset electrical current that would otherwise enter the input node. A root of the mean of the squared waveform voltage amplitude of a sine waveform fundamental of the forward input electrical current may be calculated from a zero-volts crossing slope of the sine waveform fundamental in engineering units of volts per seconds by dividing the zero-volts crossing slope by a product of square root of numeral 2, numeral 2, pi, and an alternating frequency of the sine waveform fundamental in engineering units of Hertz.

The reverse first amplifier may be configured such that the reverse arrangement includes a voltage amplifier having a positive input, a negative input, and a local voltage output with a second linear operating voltage range configured such that the positive input is coupled to a system zero-volt common, an input impedance connected between the output node of the saturation prevention signal conditioning method and the negative input of the voltage amplifier, and a local feedback impedance connected between the negative input and the voltage output of the voltage amplifier, wherein a voltage gain-setting ratio determined by the local feedback impedance divided by the input impedance is set such that the voltage output of the voltage amplifier produces a maximum voltage in either negative or positive sense determined by the second linear operating voltage range when the forward output voltage is at the top of the predetermined lower region of the linear operating voltage range of the forward last amplifier, wherein, whenever the voltage output is below the maximum voltage in either the positive or negative sense, a negative input voltage on the negative input of the voltage amplifier remains substantially zero volts, wherein, whenever the voltage output is equal to the maximum voltage in either positive or negative sense, additional increase in the forward output voltage produces proportionate increase in the negative input voltage on the negative input of the voltage amplifier, and wherein the reverse arrangement is configured such that the negative input voltage on the negative input of the voltage amplifier ultimately and proportionately produces the reverse input electrical current that flows through the reverse impedance of the saturation prevention signal conditioning method. An isolated DC bipolar power supply may be used to power the saturation prevention signal conditioning method and is configured such that the isolated DC bipolar power supply is adequately isolated from the source of electrical current such that the input node and the system zero-volt common node can be coupled in series into any opening at any point along the source of electrical current circuit.

An example embodiment of a combination electrical current signal conditioning system for substantially instantaneously conditioning an electrical current over the range of several orders of magnitude of a conditioned electrical current may include a current transformer and the saturation prevention electrical current signal conditioning system modified as specified above, wherein the input node of the saturation prevention signal conditioning method is coupled to a first node of a secondary winding of the current transformer and a second node of the secondary winding of the current transformer coupled to the system zero-volt common, wherein the forward input electrical current of the saturation prevention signal conditioning method is a secondary winding current of the current transformer and a primary winding current of the current transformer is the conditioned current, and wherein the conditioned electrical current is substantially instantaneously greater than the forward input electrical current by a factor of secondary winding turns to primary winding turns ratio of the current transformer. The current transformer may have a magnetic core engineered to have maximally high permeability and minimally low loss characteristics.

Another example embodiment of a combination electrical current signal conditioning system for substantially instantaneously conditioning electrical current over the range of several orders of magnitude of the conditioned electrical current may include the current transformer, the saturation prevention electrical current signal conditioning method modified as specified above, and a high range transimpedance current conditioning system including a second forward plurality of amplifiers and passives configured in a second forward arrangement including a second forward last amplifier and a second forward first amplifier configured to have a second total forward gain-bandwidth product and a second inverting forward gain that is defined as a second ratio of magnitudes of forward output to forward input electrical signals, a second input node coupled to both the second node of the secondary winding of the current transformer to be conditioned and to a second forward input of the second forward first amplifier of the second forward arrangement, a second output node coupled to a second forward output of the second forward last amplifier within the second forward arrangement that produces a second forward output voltage representing a second conditioned instantaneous analogue of the forward input electrical current with good accuracy of reading when the forward input electrical current is within a predetermined upper portion that is equivalent to the range of several orders of magnitude not corresponding to the predetermined lower region of the linear operating voltage range of the forward last amplifier, and a second feedback impedance having a second feedback magnitude coupled in parallel with the second forward arrangement between the second input node and the second output node, wherein the input node of the saturation prevention signal conditioning method is coupled to the first node of the secondary winding of the current transformer, wherein the second total forward voltage gain-bandwidth product of the second forward arrangement is sufficiently large to pull through the second feedback impedance substantially all flow of the forward input electrical current entering the second input node such that the second feedback magnitude of the second feedback impedance substantially determines a high range transimpedance that produces the second forward output voltage on the second output node responsive to the forward input electrical current, and wherein the forward input electrical current of the saturation prevention signal conditioning method is a secondary winding current of the current transformer and a primary winding current of the current transformer is the conditioned current, and wherein the conditioned electrical current is substantially instantaneously greater than the forward input electrical current by the factor of secondary winding turns to primary winding turns ratio of the current transformer.

Another combination electrical current signal conditioning system for substantially instantaneously conditioning electrical current over the range of several orders of magnitude of the conditioned electrical current may include the saturation prevention signal conditioning method modified as specified above; and the high range transimpedance current conditioning system discussed above including a second system zero-volt common isolated from the system zero-volt common of the saturation prevention signal conditioning method, and a second isolated DC bipolar power supply coupled to the second system zero-volt common for providing power to the high range transimpedance current conditioning system, except the input node is not coupled to the first node of the secondary winding of the current transformer, except the second input node is not coupled to the second node of the secondary winding of the current transformer; except the forward input electrical current of the saturation prevention signal conditioning method is not the secondary winding current of the current transformer and the primary winding current of the current transformer is not the conditioned current, except the conditioned electrical current is not greater than the forward input electrical current, wherein the second isolated DC bipolar power supply is adequately isolated from both the source of electrical current and the isolated DC bipolar power supply powering the saturation prevention signal conditioning method such that the input node and the system zero-volt common node pair are coupled in series with the second input node and the second system zero-volt common node pair into any opening at any point along the source of electrical current circuit so that the saturation prevention signal conditioning method and the high range transimpedance current conditioning system receive the forward input electrical current, and wherein the conditioned electrical current is equal to the forward input electrical current.

The feedback impedance may include a precision resistor and a capacitor, wherein the precision resistor sets the DC to low frequency effective transimpedance and has very small room temperature value tolerance and small temperature coefficient of resistance characteristics, wherein the capacitor reduces noise bandwidth and participates in system compensation.

The feedback impedance may include a precision resistor and a capacitor, wherein the precision resistor sets the DC to low frequency effective transimpedance and has very small room temperature value tolerance and small temperature coefficient of resistance characteristics, wherein the capacitor reduces noise bandwidth and participates in system compensation, wherein the second feedback impedance is comprised of a second precision resistor and a second capacitor, wherein the second precision resistor sets the DC to low frequency effective transimpedance and has very small room temperature value tolerance and small temperature coefficient of resistance characteristics, wherein the second capacitor reduces noise bandwidth and participates in system compensation.

According to another example embodiment of the present general inventive concept, a signal conditioning circuit may include a forward module having a forward input to receive a forward input electrical signal and a forward output to output a forward output electrical signal, the forward module being configured to have a substantially instantaneous response and an inverting forward gain defined as a ratio of magnitudes of forward output electrical signals to forward input electrical signals, an input summation module including a first sum input coupled to a source of an electrical signal, a second sum input, and a total sum output coupled to the forward input of the forward module to produce the forward input electrical signal, and a reverse module including a reverse input and a reverse output, the reverse module being configured in anti-parallel with the forward module by coupling the reverse input to the forward output and by coupling the reverse output to the second sum input, and to have a substantially instantaneous response and a non-inverting reverse gain defined as a ratio of magnitudes of reverse output electrical signals to reverse input electrical signals, wherein the forward output electrical signal represents an analogue of the forward input electrical signal multiplied by the inverting forward gain when a magnitude of the forward output electrical signal is within a predetermined region of a linear operating range of the forward module.

The predetermined region may have a threshold value equal to a predetermined percentage of the linear operating range. The first sum input may exhibit an impedance of substantially zero ohms if the input electrical signal is an input electrical current signal, and of substantially infinite ohms if the input electrical signal is an input voltage signal.

The reverse module may be configured such that reverse output produces a reverse output electrical signal only when the magnitude of the forward output electrical signal exceeds the threshold value. The reverse module may be configured such that the reverse output electrical signal increases in proportion to a difference between the threshold value and the magnitude of the forward output electrical signal. The reverse output electrical signal is equal to the difference between the threshold value and the magnitude of the forward output electrical signal multiplied by the non-inverting reverse gain. The reverse output electrical signal, when non-zero, subtracts from the input electrical signal through the input summation module to reduce an increase of the forward input electrical signal.

Changes in magnitude of the forward output electrical signal may be equal to changes in magnitude of the input electrical signal divided by the sum of the non-inverting reverse gain magnitude and of the reciprocal of the inverting forward gain magnitude whenever the magnitude of the forward output electrical signal is above the threshold value. The inverting forward gain and the non-inverting reverse gain may produce the forward output electrical signal and the reverse output electrical signal, respectively, the forward output electrical signal and the reverse output electrical signal being inverted relative to the input electrical signal. The inverting forward gain of the forward module may be a non-inverting forward gain, and the non-inverting reverse gain of the reverse module may be an inverting gain, such that the forward module produces the forward output electrical signal non-inverted relative to the input electrical signal, and the reverse module produces the reverse output electrical signal inverted relative to the input electrical signal.

The reverse module may include a plurality of N reverse modules to produce N reverse output electrical signals such that the total sum output is a summation of N+1 signal values, being the N reverse output electrical signals summed with the input signal from the source to form the forward input electrical signal. The N reverse modules may be configured to correspond to N threshold values, each corresponding to an increasing forward output signal magnitude and each within the linear operating range of the forward module, such that as each of the respective threshold values of the N reverse modules are exceeded by the increasing forward output signal magnitude, the gain is changed by adding a next one of the N reverse modules having a next sequential threshold value.

According to another example embodiment of the present general inventive concept, a signal conditioning circuit may include an input node to receive an input signal, an output node, a forward module coupled between the input node and the output node, the forward module being configured to amplify and invert the input signal and to present a forward output signal to the output node, the forward output signal being an analogue of the input signal, and a reverse module coupled in anti-parallel with the forward module between the output node and the input node to receive the forward output signal as a reverse input signal and to present a reverse output signal to the input node, wherein the reverse module is configured such that the reverse module does not present the reverse output signal to the input node until the forward output signal exceeds a predetermined magnitude based on a linear operating voltage range of the forward module.

The forward module may include a plurality of amplifiers and passive elements including a forward first amplifier and a forward last amplifier configured to have an inverting forward gain defined as a ratio of magnitudes of the forward output signal to the input signal, and wherein an input of the forward first amplifier is coupled to the input node and an output of the forward last amplifier is coupled to the output node. The forward module further may further include a feedback impedance coupled in parallel with the plurality of amplifiers between the input node and the output node.

The reverse module may include a plurality of amplifiers and passive elements including a reverse first amplifier and a reverse last amplifier to provide a non-inverting reverse gain defined as a ratio of magnitudes of the reverse output signal to the reverse input signal, wherein an input of the reverse first amplifier is coupled to the output node. The reverse module may further include a reverse impedance coupled in series between an output of the reverse last amplifier and the input node.

The forward module may be configured such that a magnitude of the feedback impedance determines a maximum transimpedance that produces the forward output signal.

The reverse impedance may be smaller than the feedback impedance of the forward module, and wherein the reverse impedance converts a reverse output voltage of the reverse last amplifier to a reverse output signal presented to the input node.

The reverse module may be configured such that after the forward output signal exceeds the predetermined magnitude, the reverse output signal presented to the input node increases in proportion to a difference between the forward output signal and the predetermined magnitude.

The predetermined magnitude may correspond to a predetermined lower region of a linear operating voltage range of the forward last amplifier.

The reverse output signal may combine with the input signal to form a net forward input signal to which a transfer function of the forward module is applied to produce the forward output signal. The input signal may be an input current, the forward output signal may be a forward output voltage, the reverse output signal may be a reverse output current, the net forward input signal may be a net forward input current, and the transfer function may be a transimpedance of the forward module, and the forward output voltage may be the net forward input current multiplied by the maximum transimpedance. The net forward input current may be equal to the input current when the forward output voltage is below the predetermined magnitude, and the net forward input current may be equal to a difference between the input current and the reverse output current when the forward output voltage is above the predetermined magnitude. When the forward output voltage exceeds the predetermined magnitude, the forward output voltage may be substantially equal to the input current divided by a sum of a reciprocal of the maximum transimpedance and a ratio of a total reverse voltage gain magnitude of the reverse module to a magnitude of the reverse impedance, wherein the sum is a reciprocal of the minimum transimpedance, and when the forward output voltage is less than the predetermined magnitude, the reverse output current may not present and the forward output voltage is equal to the product of the input current and the maximum transimpedance.

The reverse impedance may include a plurality of impedances connected in series to form a fixed impedance series, and an anti-parallel diode pair coupled between the input node and the fixed impedance series such that when the forward output signal does not exceed the predetermined signal magnitude, a total noise and offset voltage generated by the reverse module is substantially prevented from producing a noise and offset current to the input node.

A root of the mean of a squared waveform voltage amplitude of a sine waveform fundamental of the input signal may be calculated from a zero-volts crossing slope of the sine waveform fundamental, in engineering units of volts per seconds, by dividing the zero-volts crossing slope by a product of the square root of the numeral 2, the numeral 2, pi, and an alternating frequency of the sine waveform fundamental in engineering units of Hertz.

The reverse first amplifier may include a positive input, a negative input, and a local voltage output with a second linear operating voltage range configured such that the positive input is coupled to a system zero-volt common. The reverse module may further include an input impedance coupled between the output node and the negative input of the reverse first amplifier, and a local feedback impedance coupled between the negative input of the reverse first amplifier and the local voltage output of the reverse first amplifier, wherein a voltage gain-setting ratio magnitude determined by the local feedback impedance divided by the input impedance is configured such that the local voltage output of the reverse first amplifier produces a maximum voltage in absolute value determined by the second linear operating voltage range when the forward inverted gain signal exceeds the predetermined signal magnitude, wherein a negative input voltage on the negative input of the reverse first amplifier remains substantially zero whenever the local voltage output is below the maximum voltage in absolute value, wherein an increase in the forward output signal produces a proportionate increase in the negative input voltage on the negative input of the reverse first amplifier whenever the local voltage output is equal to the maximum voltage in absolute value, and wherein the reverse module is configured such that the negative input voltage on the negative input of the reverse first amplifier proportionately produces a reverse input current that flows through the reverse impedance.

The signal conditioning circuit may further include an isolated DC power supply that is isolated from the input signal such that the input node and a system zero-volt common may be coupled in series at any point along a circuit supplying the input signal.

The signal conditioning circuit may further include a current transformer having a primary winding to receive a conditioning current and a secondary winding to produce the input current such that a first node of the secondary winding is coupled to the input node and a second node of the secondary winding is coupled to a system zero-volt common, wherein the conditioning current is substantially instantaneously greater than the input current by a factor of a secondary winding turns to primary winding turns ratio of the current transformer. The signal conditioning circuit may further include a high range conditioning circuit including a second input node coupled to the second node of the secondary winding to receive the input signal, a second output node, and a second forward module coupled between the second input node and the second output node, the second forward module being configured to amplify and invert the input signal and to present a second forward output signal to the second output node, the second forward output signal being an analogue of the input signal when the input current is within a range that is multiple orders of magnitude not corresponding to the predetermined lower region of the linear voltage range of the forward last amplifier. The second forward module may include a second plurality of amplifiers and passive elements including a second forward first amplifier and a second forward last amplifier configured to have a second inverting forward gain that is defined as a second ratio of magnitudes of the second forward output signal to the input signal, wherein an input of the second forward first amplifier is coupled to the second input node and the second node of the secondary winding, and an output of the second forward last amplifier is coupled to the second output node. The second forward module may further include a second feedback impedance coupled in parallel with the second plurality of amplifiers between the second input node and the second output node. The second forward module may be configured such that a second feedback impedance of the second forward module determines a second maximum transimpedance that produces the second forward output signal.

The signal conditioning circuit may further include a high range conditioning circuit including a second input node to receive a second input signal, a second output node, and a second forward module coupled between the second input node and the second output node, the second forward module being configured to amplify the input signal and to present a second forward output signal to the second output node, the second forward output signal being an analogue of the input signal when the input current is within a range that is multiple orders of magnitude not corresponding to the predetermined lower region of the linear voltage range of the forward last amplifier. The signal conditioning circuit may further include a system zero-volt common, a DC power supply coupled to the system zero-volt common to provide power to a portion of the signal conditioning circuit not including the high-range conditioning circuit, a second system zero-volt common isolated from the other system zero-volt common, and a second DC power supply coupled to the second system zero-volt common to provide power to the high range conditioning circuit.

The feedback impedance may include a first precision resistor and/or a first compensation capacitor to reduce noise bandwidth, wherein the first precision resistor is configured to set a first DC to low frequency transimpedance. The second feedback impedance may include a second precision resistor and/or a second compensation capacitor to reduce noise bandwidth, wherein the second precision resistor is configured to set a second DC to low frequency transimpedance.

According to another example embodiment of the present general inventive concept, a method of conditioning a signal may include receiving a forward input electrical signal at a forward input of a forward module, and outputting a forward output electrical signal at a forward output of the forward module, the forward module being configured to have a substantially instantaneous response and an inverting forward gain defined as a ratio of magnitudes of forward output electrical signals to forward input electrical signals, receiving the forward output electrical signal at a reverse input of a reverse module, and outputting a reverse output electrical signal at a reverse output of the reverse module, the reverse module being configured in anti-parallel with the forward module by coupling the reverse input to the forward output and by coupling the reverse output to an input summation module coupled to the forward input, and to have a substantially instantaneous response and a non-inverting reverse gain defined as a ratio of magnitudes of reverse output electrical signals to reverse input electrical signals, and summing an electrical signal, received from a source of the electrical signal at a first sum input of the input summation module, with the reverse output electrical signal received at a second sum input of the input summation module to produce the forward input electrical signal at a total sum output of the input summation module coupled to the forward input of the forward module, wherein the forward output electrical signal represents an analogue of the forward input electrical signal multiplied by the inverting forward gain when a magnitude of the forward output electrical signal is within a predetermined region of a linear operating range of the forward module.

The predetermined region may have a threshold value equal to a predetermined percentage of the linear operating range. The first sum input may exhibit an impedance of substantially zero ohms if the input electrical signal is an input electrical current signal, and of substantially infinite ohms if the input electrical signal is an input voltage signal. The reverse output electrical signal may be produced only when the magnitude of the forward output electrical signal exceeds the threshold value. The reverse output electrical signal may increase in proportion to a difference between the threshold value and the magnitude of the forward output electrical signal. The reverse output electrical signal may be equal to the difference between the threshold value and the magnitude of the forward output electrical signal multiplied by the non-inverting reverse gain. The reverse output electrical signal, when non-zero, may subtract from the input electrical signal through the input summation module to reduce an increase of the forward input electrical signal.

Changes in magnitude of the forward output electrical signal may be equal to changes in magnitude of the input electrical signal divided by the sum of the non-inverting reverse gain magnitude and of the reciprocal of the inverting forward gain magnitude whenever the magnitude of the forward output electrical signal is above the threshold value.

The inverting forward gain and the non-inverting reverse gain may produce the forward output electrical signal and the reverse output electrical signal, respectively, the forward output electrical signal and the reverse output electrical signal being inverted relative to the input electrical signal. The inverting forward gain of the forward module may be a non-inverting forward gain, and the non-inverting reverse gain of the reverse module may be an inverting gain, such that the forward module produces the forward output electrical signal non-inverted relative to the input electrical signal, and the reverse module produces the reverse output electrical signal inverted relative to the input electrical signal.

According to another example embodiment of the present general inventive concept, a method of conditioning a signal may include receiving an input signal at an input node, amplifying and inverting the input signal, through a forward module coupled between the input node and an output node, to present a forward output signal at the output node, the forward output signal being an analogue of the input signal, and receiving the forward output signal as a reverse input signal at a reverse module coupled in anti-parallel with the forward module between the output node and the input node, and presenting a reverse output signal from the reverse module to the input node when the forward output signal exceeds a predetermined magnitude based on a linear operating range of the forward module. The forward module may include a plurality of amplifiers and passive elements including a forward first amplifier and a forward last amplifier configured to have an inverting forward gain defined as a ratio of magnitudes of the forward output signal to the input signal, and wherein an input of the forward first amplifier may be coupled to the input node and an output of the forward last amplifier is coupled to the output node, and wherein the reverse module may include a plurality of amplifiers and passive elements including a reverse first amplifier and a reverse last amplifier to provide a non-inverting reverse gain defined as a ratio of magnitudes of the reverse output signal to the reverse input signal, wherein an input of the reverse first amplifier may be coupled to the output node. In another embodiment, the forward module may include a plurality of amplifiers and passive elements including a forward first amplifier and a forward last amplifier configured to have a non-inverting forward gain defined as a ratio of magnitudes of the forward output signal to the input signal, and wherein an input of the forward first amplifier may be coupled to the input node and an output of the forward last amplifier may be coupled to the output node, and wherein the reverse module may include a plurality of amplifiers and passive elements including a reverse first amplifier and a reverse last amplifier to provide an inverting reverse gain defined as a ratio of magnitudes of the reverse output signal to the reverse input signal, wherein an input of the reverse first amplifier may be coupled to the output node.

It is noted that the simplified diagrams and drawings do not illustrate all the various connections and assemblies of the various components, however, those skilled in the art will understand how to implement such connections and assemblies, based on the illustrated components, figures, and descriptions provided herein, using sound engineering judgment.

Numerous variations, modifications, and additional embodiments are possible, and accordingly, all such variations, modifications, and embodiments are to be regarded as being within the spirit and scope of the present general inventive concept. For example, regardless of the content of any portion of this application, unless clearly specified to the contrary, there is no requirement for the inclusion in any claim herein or of any application claiming priority hereto of any particular described or illustrated activity or element, any particular sequence of such activities, or any particular interrelationship of such elements. Moreover, any activity can be repeated, any activity can be performed by multiple entities, and/or any element can be duplicated.

While the present general inventive concept has been illustrated by description of several example embodiments, and while the illustrative embodiments have been described in detail, it is not the intention of the applicant to restrict or in any way limit the scope of the general inventive concept to such descriptions and illustrations. Instead, the descriptions, drawings, and claims herein are to be regarded as illustrative in nature, and not as restrictive, and additional embodiments will readily appear to those skilled in the art upon reading the above description and drawings. Additional modifications will readily appear to those skilled in the art. Accordingly, departures may be made from such details without departing from the spirit or scope of applicant's general inventive concept.

The invention claimed is:

1. A signal conditioning circuit, comprising:
a forward module having a forward input to receive a forward input electrical signal and a forward output to output a forward output electrical signal, the forward module being configured to have a substantially instantaneous response and an inverting forward gain defined as a ratio of magnitudes of forward output electrical signals to forward input electrical signals;
an input summation module including a first sum input coupled to a source of an input electrical signal, a second sum input, and a total sum output coupled to the forward input of the forward module to produce the forward input electrical signal; and
a reverse module including a reverse input to receive a reverse input electrical signal and a reverse output to output a reverse output electrical signal, the reverse module being configured in anti-parallel with the forward module by coupling the reverse input to the forward output and by coupling the reverse output to the second sum input, and to have a substantially instantaneous response and a non-inverting reverse gain defined as a ratio of magnitudes of reverse output electrical signals to reverse input electrical signals;
wherein the forward output electrical signal represents an analogue of the forward input electrical signal multiplied by the inverting forward gain when a magnitude of the forward output electrical signal is within a predetermined region of a linear operating range of the forward module, and
wherein the first sum input exhibits an impedance of substantially zero ohms if the input electrical signal is an input electrical current signal, and of substantially infinite ohms if the input electrical signal is an input voltage signal.

2. The signal conditioning circuit of claim 1, wherein the predetermined region has a threshold value equal to a predetermined percentage of the linear operating range.

3. The signal conditioning circuit of claim 2, wherein the reverse module is configured such that the reverse output produces the reverse output electrical signal only when the magnitude of the forward output electrical signal exceeds the threshold value.

4. The signal conditioning circuit of claim 3, wherein the reverse module is configured such that the reverse output electrical signal increases in proportion to a difference between the threshold value and the magnitude of the forward output electrical signal.

5. The signal conditioning circuit of claim 4, wherein the reverse output electrical signal is equal to the difference between the threshold value and the magnitude of the forward output electrical signal multiplied by the non-inverting reverse gain.

6. The signal conditioning circuit of claim 4, wherein the reverse output electrical signal, when non-zero, subtracts from the input electrical signal through the input summation module to reduce an increase of the forward input electrical signal.

7. The signal conditioning circuit of claim 1, wherein changes in magnitude of the forward output electrical signal are equal to changes in magnitude of the input electrical signal divided by the sum of the non-inverting reverse gain magnitude and of the reciprocal of the inverting forward gain magnitude whenever the magnitude of the forward output electrical signal is above the threshold value.

8. The signal conditioning circuit of claim 1, wherein the inverting forward gain and the non-inverting reverse gain produce the forward output electrical signal and the reverse output electrical signal, respectively, the forward output electrical signal and the reverse output electrical signal being inverted relative to the input electrical signal.

9. The signal conditioning circuit of claim 1, wherein the inverting forward gain of the forward module is a non-inverting forward gain, and the non-inverting reverse gain of the reverse module is an inverting gain, such that the forward module produces the forward output electrical signal non-inverted relative to the input electrical signal, and the reverse module produces the reverse output electrical signal inverted relative to the input electrical signal.

10. The signal conditioning circuit of claim 1, wherein the reverse module comprises a plurality of N reverse modules to produce N reverse output electrical signals such that the total sum output is a summation of N+1 signal values, being the N reverse output electrical signals summed with the input electrical signal from the source to form the forward input electrical signal.

11. The signal conditioning circuit of claim 10, wherein the N reverse modules are configured to correspond to N threshold values, each corresponding to an increasing forward output signal magnitude and each within the linear operating range of the forward module, such that as each of the respective threshold values of the N reverse modules are exceeded by the increasing forward output signal magnitude, an overall gain is changed by adding a next one of the N reverse modules having a next sequential threshold value.

12. A signal conditioning circuit, comprising:
an input node to receive an input signal;
an output node;
a forward module coupled between the input node and the output node, the forward module being configured to amplify and invert the input signal and to present a forward output signal to the output node, the forward output signal being an analogue of the input signal; and
a reverse module coupled in anti-parallel with the forward module between the output node and the input node to receive the forward output signal as a reverse input signal and to present a reverse output signal to the input node,
wherein the reverse module is configured such that the reverse module does not present the reverse output signal to the input node until the forward output signal exceeds a predetermined magnitude based on a linear operating voltage range of the forward module, and
wherein the forward module comprises a plurality of amplifiers and passive elements including a forward first amplifier and a forward last amplifier configured to have an inverting forward gain defined as a ratio of magnitudes of the forward output signal to the input signal, and wherein an input of the forward first amplifier is coupled to the input node and an output of the forward last amplifier is coupled to the output node.

13. The signal conditioning circuit of claim 12, wherein the forward module further comprises a feedback impedance coupled in parallel with the plurality of amplifiers and passive elements between the input node and the output node.

14. The signal conditioning circuit of claim 12, wherein the reverse module comprises a plurality of amplifiers and passive elements including a reverse first amplifier and a reverse last amplifier to provide a non-inverting reverse gain defined as a ratio of magnitudes of the reverse output signal to the reverse input signal, wherein an input of the reverse first amplifier is coupled to the output node.

15. The signal conditioning circuit of claim 14, wherein the reverse module further comprises a reverse impedance coupled in series between an output of the reverse last amplifier and the input node.

16. The signal conditioning circuit of claim 13, wherein the forward module is configured such that a magnitude of the feedback impedance determines a maximum transimpedance that produces the forward output signal.

17. The signal conditioning circuit of claim 15, wherein the forward module further comprises a feedback impedance coupled in parallel with the plurality of amplifiers and passive elements between the input node and the output node,
wherein the reverse impedance is smaller than the feedback impedance of the forward module, and
wherein the reverse impedance converts a reverse output voltage of the reverse last amplifier to a reverse output signal presented to the input node.

18. The signal conditioning circuit of claim 12, wherein the reverse module is configured such that after the forward output signal exceeds the predetermined magnitude, the reverse output signal presented to the input node increases in proportion to a difference between the forward output signal and the predetermined magnitude.

19. The signal conditioning circuit of claim 12, wherein the predetermined magnitude corresponds to a predetermined lower region of a linear operating voltage range of the forward last amplifier.

20. The signal conditioning circuit of claim 17, wherein the reverse output signal combines with the input signal to form a net forward input signal to which a transfer function of the forward module is applied to produce the forward output signal.

21. The signal conditioning circuit of claim 20, wherein the input signal is an input current, the forward output signal is a forward output voltage, the reverse output signal is a reverse output current, the net forward input signal is a net forward input current, and the transfer function is a transimpedance of the forward module, and
wherein the forward output voltage is the net forward input current multiplied by the transimpedance of the forward module.

22. The signal conditioning circuit of claim 21, wherein the net forward input current is equal to the input current when the forward output voltage is below the predetermined magnitude; and
the net forward input current is equal to a difference between the input current and the reverse output current when the forward output voltage is above the predetermined magnitude.

23. The signal conditioning circuit of claim 22, wherein, when the forward output voltage exceeds the predetermined magnitude, the forward output voltage is substantially equal to the input current divided by a sum of a reciprocal of the maximum transimpedance and a ratio of a total reverse voltage gain magnitude of the reverse module to a magnitude of the reverse impedance, wherein the sum is a reciprocal of a minimum transimpedance, and
when the forward output voltage is less than the predetermined magnitude, the reverse output current is not present and the forward output voltage is equal to the product of the input current and the maximum transimpedance.

24. The signal conditioning circuit of claim 15, wherein the reverse impedance comprises:
a plurality of impedances connected in series to form a fixed impedance series; and
an anti-parallel diode pair coupled between the input node and the fixed impedance series such that when the forward output signal does not exceed the predetermined magnitude, a total noise and offset voltage generated by the reverse module is substantially prevented from producing a noise and offset current to the input node.

25. The signal conditioning circuit of claim 12, wherein a root of the mean of a squared waveform voltage amplitude of a sine waveform fundamental of the input signal is calculated from a zero-volts crossing slope of the sine waveform fundamental, in engineering units of volts per seconds, by dividing the zero-volts crossing slope by a product of the square root of the numeral 2, the numeral 2, pi, and an alternating frequency of the sine waveform fundamental in engineering units of Hertz.

26. The signal conditioning circuit of claim 15, wherein the reverse first amplifier includes a positive input, a negative input, and a local voltage output with a second linear operating voltage range configured such that the positive input is coupled to a system zero-volt common.

27. The signal conditioning circuit of claim 26, wherein the reverse module further comprises:
an input impedance coupled between the output node and the negative input of the reverse first amplifier; and
a local feedback impedance coupled between the negative input of the reverse first amplifier and the local voltage output of the reverse first amplifier;
wherein a voltage gain-setting ratio magnitude determined by the local feedback impedance divided by the input impedance is configured such that the local voltage output of the reverse first amplifier produces a maximum voltage in absolute value determined by the second linear operating voltage range when a forward inverted gain signal exceeds the predetermined magnitude;
wherein a negative input voltage on the negative input of the reverse first amplifier remains substantially zero whenever the local voltage output is below the maximum voltage in absolute value;
wherein an increase in the forward output signal produces a proportionate increase in the negative input voltage on the negative input of the reverse first amplifier whenever the local voltage output is equal to the maximum voltage in absolute value; and
wherein the reverse module is configured such that the negative input voltage on the negative input of the reverse first amplifier proportionately produces a reverse input current that flows through the reverse impedance.

28. The signal conditioning circuit of claim 12, further comprising an isolated DC power supply that is isolated from the input signal such that the input node and a system zero-volt common may be coupled in series at any point along a circuit supplying the input signal.

29. The signal conditioning circuit of claim 13, further comprising:
a current transformer having a primary winding to receive a conditioning current and a secondary winding to produce the input signal as an input current such that a first node of the secondary winding is coupled to the input node and a second node of the secondary winding is coupled to a system zero-volt common;
wherein the conditioning current is substantially instantaneously greater than the input current by a factor of a secondary winding turns to primary winding turns ratio of the current transformer.

30. The signal conditioning circuit of claim 29, further comprising a high range conditioning circuit, comprising:
a second input node coupled to the second node of the secondary winding to receive the input signal;
a second output node; and
a second forward module coupled between the second input node and the second output node, the second forward module being configured to amplify and invert the input signal and to present a second forward output signal to the second output node, the second forward output signal being an analogue of the input signal as the input current when the input current is within a range that is not corresponding to a predetermined lower region of the linear operating voltage range of the forward last amplifier.

31. The signal conditioning circuit of claim 30, wherein the second forward module comprises a second plurality of amplifiers and passive elements including a second forward first amplifier and a second forward last amplifier configured to have a second inverting forward gain that is defined as a second ratio of magnitudes of the second forward output signal to the input signal, wherein an input of the second forward first amplifier is coupled to the second input node and the second node of the secondary winding, and an output of the second forward last amplifier is coupled to the second output node.

32. The signal conditioning circuit of claim 31, wherein the second forward module further comprises a second feedback impedance coupled in parallel with the second plurality of amplifiers and passive elements between the second input node and the second output node.

33. The signal conditioning circuit of claim 32, wherein the second forward module is configured such that a second feedback impedance of the second forward module determines a second maximum transimpedance that produces the second forward output signal.

34. The signal conditioning circuit of claim 13, further comprising:
a high range conditioning circuit comprising:
a second input node to receive a second input signal;
a second output node; and
a second forward module coupled between the second input node and the second output node, the second forward module being configured to amplify the input signal and to present a second forward output signal to the second output node, the second forward output signal being an analogue of the input signal when the input signal is an input current that is within a range that is not corresponding to a predetermined lower region of the linear operating voltage range of the forward last amplifier.

35. The signal conditioning circuit of claim 34, further comprising:
a system zero-volt common;
a DC power supply coupled to the system zero-volt common to provide power to a portion of the signal conditioning circuit not including the high-range conditioning circuit;
a second system zero-volt common isolated from the other system zero-volt common; and
a second DC power supply coupled to the second system zero-volt common to provide power to the high range conditioning circuit.

36. The signal conditioning circuit of claim 32, wherein the feedback impedance comprises:
a first precision resistor and/or a first compensation capacitor to reduce noise bandwidth, wherein the first precision resistor is configured to set a first DC to low frequency transimpedance.

37. The signal conditioning circuit of claim 36, wherein the second feedback impedance comprises:
a second precision resistor and/or a second compensation capacitor to reduce noise bandwidth,
wherein the second precision resistor is configured to set a second DC to low frequency transimpedance.

38. A method of conditioning a signal, the method comprising:
receiving a forward input electrical signal at a forward input of a forward module, and outputting a forward output electrical signal at a forward output of the forward module, the forward module being configured to have a substantially instantaneous response and an inverting forward gain defined as a ratio of magnitudes of forward output electrical signals to forward input electrical signals;
receiving the forward output electrical signal at a reverse input of a reverse module, and outputting a reverse output electrical signal at a reverse output of the reverse module, the reverse module being configured in anti-parallel with the forward module by coupling the reverse input to the forward output and by coupling the reverse output to an input summation module coupled to the forward input, and to have a substantially instantaneous response and a non-inverting reverse gain defined as a ratio of magnitudes of reverse output electrical signals to reverse input electrical signals; and summing an input electrical signal, received from a source of the input electrical signal at a first sum input of the input summation module, with the reverse output electrical signal received at a second sum input of the input summation module to produce the forward input electrical signal at a total sum output of the input summation module coupled to the forward input of the forward module, wherein the forward output electrical signal represents an analogue of the forward input electrical signal multiplied by the inverting forward gain when a magnitude of the forward output electrical signal is within a predetermined region of a linear operating range of the forward module.

39. The method of claim 38, wherein the predetermined region has a threshold value equal to a predetermined percentage of the linear operating range.

40. The method of claim 38, wherein the first sum input exhibits an impedance of substantially zero ohms if the input electrical signal is an input electrical current signal, and of substantially infinite ohms if the input electrical signal is an input voltage signal.

41. The method of claim 39, wherein the reverse output electrical signal is produced only when the magnitude of the forward output electrical signal exceeds the threshold value.

42. The method of claim 41, wherein the reverse output electrical signal increases in proportion to a difference between the threshold value and the magnitude of the forward output electrical signal.

43. The method of claim 42, wherein the reverse output electrical signal is equal to the difference between the threshold value and the magnitude of the forward output electrical signal multiplied by the non-inverting reverse gain.

44. The method of claim 42, wherein the reverse output electrical signal, when non-zero, subtracts from the input electrical signal through the input summation module to reduce an increase of the forward input electrical signal.

45. The method of claim 38, wherein changes in magnitude of the forward output electrical signal are equal to changes in magnitude of the input electrical signal divided by the sum of the non-inverting reverse gain magnitude and of the reciprocal of the inverting forward gain magnitude whenever the magnitude of the forward output electrical signal is above the threshold value.

46. The method of claim 38, wherein the inverting forward gain and the non-inverting reverse gain produce the forward output electrical signal and the reverse output electrical signal, respectively, the forward output electrical signal and the reverse output electrical signal being inverted relative to the input electrical signal.

47. The method of claim 38, wherein the inverting forward gain of the forward module is a non-inverting forward gain, and the non-inverting reverse gain of the reverse module is an inverting gain, such that the forward module produces the forward output electrical signal non-inverted relative to the input electrical signal, and the reverse module produces the reverse output electrical signal inverted relative to the input electrical signal.

48. A method of conditioning a signal, the method comprising:
receiving an input signal at an input node;
amplifying and inverting the input signal, through a forward module coupled between the input node and an output node, to present a forward output signal at the output node, the forward output signal being an analogue of the input signal; and
receiving the forward output signal as a reverse input signal at a reverse module coupled in anti-parallel with the forward module between the output node and the input node, and presenting a reverse output signal from the reverse module to the input node when the forward output signal exceeds a predetermined magnitude based on a linear operating range of the forward module,
wherein the forward module comprises a plurality of amplifiers and passive elements including a forward first amplifier and a forward last amplifier configured to have an inverting forward gain defined as a ratio of magnitudes of the forward output signal to the input signal when the forward output signal is within the predetermined magnitude based on the linear operating range of the forward module, and wherein an input of the forward first amplifier is coupled to the input node and an output of the forward last amplifier is coupled to the output node, and
wherein the reverse module comprises a plurality of amplifiers and passive elements including a reverse first amplifier and a reverse last amplifier to provide a non-inverting reverse gain defined as a ratio of magnitudes of the reverse output signal to the reverse input signal, wherein an input of the reverse first amplifier is coupled to the output node.

49. A method of conditioning a signal, the method comprising:
receiving an input signal at an input node;
amplifying and inverting the input signal, through a forward module coupled between the input node and an output node, to present a forward output signal at the output node, the forward output signal being an analogue of the input signal; and
receiving the forward output signal as a reverse input signal at a reverse module coupled in anti-parallel with the forward module between the output node and the input node, and presenting a reverse output signal from the reverse module to the input node when the forward output signal exceeds a predetermined magnitude based on a linear operating range of the forward module,
wherein the forward module comprises a plurality of amplifiers and passive elements including a forward first amplifier and a forward last amplifier configured to have a non-inverting forward gain defined as a ratio of magnitudes of the forward output signal to the input signal when the forward output signal is within the predetermined magnitude based on the linear operating range of the forward module, and wherein an input of the forward first amplifier is coupled to the input node and an output of the forward last amplifier is coupled to the output node, and
wherein the reverse module comprises a plurality of amplifiers and passive elements including a reverse first amplifier and a reverse last amplifier to provide an inverting reverse gain defined as a ratio of magnitudes of the reverse output signal to the reverse input signal, wherein an input of the reverse first amplifier is coupled to the output node.

50. A signal conditioning circuit, comprising:
a forward module having a forward input to receive a forward input electrical signal and a forward output to output a forward output electrical signal, the forward module being configured to have a substantially instantaneous response and an inverting forward gain defined as a ratio of magnitudes of forward output electrical signals to forward input electrical signals;
an input summation module including a first sum input coupled to a source of an input electrical signal, a second sum input, and a total sum output coupled to the forward input of the forward module to produce the forward input electrical signal; and
a reverse module including a reverse input to receive a reverse input electrical signal and a reverse output to output a reverse output electrical signal, the reverse module being configured in anti-parallel with the forward module by coupling the reverse input to the forward output and by coupling the reverse output to the second sum input, and to have a substantially instantaneous response and a non-inverting reverse gain defined as a ratio of magnitudes of reverse output electrical signals to reverse input electrical signals,
wherein the forward output electrical signal represents an analogue of the forward input electrical signal multiplied by the inverting forward gain when a magnitude of the forward output electrical signal is within a predetermined region of a linear operating range of the forward module, and
wherein the reverse module comprises a plurality of N reverse modules to produce N reverse output electrical signals such that the total sum output is a summation of N+1 signal values, being the N reverse output electrical signals summed with the input electrical signal from the source to form the forward input electrical signal.

51. The signal conditioning circuit of claim 50, wherein the predetermined region has a threshold value equal to a predetermined percentage of the linear operating range.

52. The signal conditioning circuit of claim 50, wherein the first sum input exhibits an impedance of substantially zero ohms if the input electrical signal is an input electrical current signal, and of substantially infinite ohms if the input electrical signal is an input voltage signal.

53. The signal conditioning circuit of claim 51, wherein the reverse module is configured such that the reverse output produces the reverse output electrical signal only when the magnitude of the forward output electrical signal exceeds the threshold value.

54. The signal conditioning circuit of claim 53, wherein the reverse module is configured such that the reverse output electrical signal increases in proportion to a difference between the threshold value and the magnitude of the forward output electrical signal.

55. The signal conditioning circuit of claim 54, wherein the reverse output electrical signal is equal to the difference between the threshold value and the magnitude of the forward output electrical signal multiplied by the non-inverting reverse gain.

56. The signal conditioning circuit of claim 54, wherein the reverse output electrical signal, when non-zero, subtracts from the input electrical signal through the input summation module to reduce an increase of the forward input electrical signal.

57. The signal conditioning circuit of claim 50, wherein changes in magnitude of the forward output electrical signal are equal to changes in magnitude of the input electrical signal divided by the sum of the non-inverting reverse gain magnitude and of the reciprocal of the inverting forward gain magnitude whenever the magnitude of the forward output electrical signal is above the threshold value.

58. The signal conditioning circuit of claim 50, wherein the inverting forward gain and the non-inverting reverse gain produce the forward output electrical signal and the reverse output electrical signal, respectively, the forward output electrical signal and the reverse output electrical signal being inverted relative to the input electrical signal.

59. The signal conditioning circuit of claim 50, wherein the inverting forward gain of the forward module is a non-inverting forward gain, and the non-inverting reverse gain of the reverse module is an inverting gain, such that the forward module produces the forward output electrical signal non-inverted relative to the input electrical signal, and the reverse module produces the reverse output electrical signal inverted relative to the input electrical signal.

60. The signal conditioning circuit of claim 50, wherein the N reverse modules are configured to correspond to N threshold values, each corresponding to an increasing forward output signal magnitude and each within the linear operating range of the forward module, such that as each of the respective threshold values of the N reverse modules are exceeded by the increasing forward output signal magnitude, an overall gain is changed by adding a next one of the N reverse modules having a next sequential threshold value.

61. A signal conditioning circuit, comprising:
an input node to receive an input signal;
an output node;
a forward module coupled between the input node and the output node, the forward module being configured to amplify and invert the input signal and to present a forward output signal to the output node, the forward output signal being an analogue of the input signal; and
a reverse module coupled in anti-parallel with the forward module between the output node and the input node to receive the forward output signal as a reverse input signal and to present a reverse output signal to the input node,
wherein the reverse module is configured such that the reverse module does not present the reverse output signal to the input node until the forward output signal exceeds a predetermined magnitude based on a linear operating voltage range of the forward module, and
wherein a root of the mean of a squared waveform voltage amplitude of a sine waveform fundamental of the input signal is calculated from a zero-volts crossing slope of the sine waveform fundamental, in engineering units of volts per seconds, by dividing the zero-volts crossing slope by a product of the square root of the numeral 2, the numeral 2, pi, and an alternating frequency of the sine waveform fundamental in engineering units of Hertz.

62. A signal conditioning circuit, comprising:
an input node to receive an input signal;
an output node;
a forward module coupled between the input node and the output node, the forward module being configured to amplify and invert the input signal and to present a forward output signal to the output node, the forward output signal being an analogue of the input signal;
a reverse module coupled in anti-parallel with the forward module between the output node and the input node to receive the forward output signal as a reverse input signal and to present a reverse output signal to the input node; and
an isolated DC power supply that is isolated from the input signal such that the input node and a system zero-volt common may be coupled in series at any point along a circuit supplying the input signal, wherein the reverse module is configured such that the reverse module does not present the reverse output signal to the input node until the forward output signal exceeds a predetermined magnitude based on a linear operating voltage range of the forward module.

63. A signal conditioning circuit, comprising:
an input node to receive an input signal;
an output node;
a forward module coupled between the input node and the output node, the forward module being configured to amplify and invert the input signal and to present a forward output signal to the output node, the forward output signal being an analogue of the input signal; and
a reverse module coupled in anti-parallel with the forward module between the output node and the input node to receive the forward output signal as a reverse input signal and to present a reverse output signal to the input node,
wherein the reverse module is configured such that the reverse module does not present the reverse output signal to the input node until the forward output signal exceeds a predetermined magnitude based on a linear operating voltage range of the forward module,
wherein the reverse module comprises a plurality of amplifiers and passive elements including a reverse first amplifier and a reverse last amplifier to provide a non-inverting reverse gain defined as a ratio of magnitudes of the reverse output signal to the reverse input signal, wherein an input of the reverse first amplifier is coupled to the output node,
wherein the reverse module further comprises a reverse impedance coupled in series between an output of the reverse last amplifier and the input node, and
wherein the reverse impedance comprises:
 a plurality of impedances connected in series to form a fixed impedance series; and
 an anti-parallel diode pair coupled between the input node and the fixed impedance series such that when the forward output signal does not exceed the predetermined magnitude, a total noise and offset voltage generated by the reverse module is substantially prevented from producing a noise and offset current to the input node.

64. A signal conditioning circuit, comprising:
an input node to receive an input signal;
an output node;
a forward module coupled between the input node and the output node, the forward module being configured to amplify and invert the input signal and to present a forward output signal to the output node, the forward output signal being an analogue of the input signal; and
a reverse module coupled in anti-parallel with the forward module between the output node and the input node to receive the forward output signal as a reverse input signal and to present a reverse output signal to the input node,
wherein the reverse module is configured such that the reverse module does not present the reverse output signal to the input node until the forward output signal exceeds a predetermined magnitude based on a linear operating voltage range of the forward module,
wherein the reverse module comprises a plurality of amplifiers and passive elements including a reverse first amplifier and a reverse last amplifier to provide a non-inverting reverse gain defined as a ratio of magnitudes of the reverse output signal to the reverse input signal, wherein an input of the reverse first amplifier is coupled to the output node,
wherein the reverse module further comprises a reverse impedance coupled in series between an output of the reverse last amplifier and the input node, and
wherein the reverse first amplifier includes a positive input, a negative input, and a local voltage output with a second linear operating voltage range configured such that the positive input is coupled to a system zero-volt common.

65. A signal conditioning circuit, comprising:
an input node to receive an input signal;
an output node;
a forward module coupled between the input node and the output node, the forward module being configured to amplify and invert the input signal and to present a forward output signal to the output node, the forward output signal being an analogue of the input signal; and
a reverse module coupled in anti-parallel with the forward module between the output node and the input node to receive the forward output signal as a reverse input signal and to present a reverse output signal to the input node,
wherein the reverse module is configured such that the reverse module does not present the reverse output signal to the input node until the forward output signal exceeds a predetermined magnitude based on a linear operating voltage range of the forward module,
wherein the reverse module comprises a plurality of amplifiers and passive elements including a reverse first amplifier and a reverse last amplifier to provide a non-inverting reverse gain defined as a ratio of magnitudes of the reverse output signal to the reverse input signal, wherein an input of the reverse first amplifier is coupled to the output node,
wherein the reverse module further comprises a reverse impedance coupled in series between an output of the reverse last amplifier and the input node,
wherein the forward module further comprises a feedback impedance coupled in parallel with the plurality of amplifiers and passive elements between the input node and the output node,
wherein the reverse impedance is smaller than the feedback impedance of the forward module,
wherein the reverse impedance converts a reverse output voltage of the reverse last amplifier to a reverse output signal presented to the input node,
wherein the reverse output signal combines with the input signal to form a net forward input signal to which a transfer function of the forward module is applied to produce the forward output signal,
wherein the input signal is an input current, the forward output signal is a forward output voltage, the reverse output signal is a reverse output current, the net forward input signal is a net forward input current, and the transfer function is a transimpedance of the forward module, and
wherein the forward output voltage is the net forward input current multiplied by the transimpedance of the forward module.

* * * * *